(12) United States Patent
De Gersem et al.

(10) Patent No.: US 10,630,209 B2
(45) Date of Patent: Apr. 21, 2020

(54) ELECTRICAL MACHINES

(71) Applicant: KATHOLIEKE UNIVERSITEIT LEUVEN, Leuven (BE)

(72) Inventors: Herbert De Gersem, Gross-Gerau (DE); Georges Gielen, Kessel-Lo (BE); Joan Peuteman, Bruges (BE); Davy Pissoort, Haaltert (BE); Dries Vanoost, Rumbeke (BE)

(73) Assignee: KATHOLIEKE UNIVERSITEIT LEUVEN, Leuven (BE)

( * ) Notice: Subject to any disclaimer, the term of this patent is extended or adjusted under 35 U.S.C. 154(b) by 572 days.

(21) Appl. No.: 15/522,970

(22) PCT Filed: Oct. 28, 2015

(86) PCT No.: PCT/EP2015/075048
§ 371 (c)(1),
(2) Date: Apr. 28, 2017

(87) PCT Pub. No.: WO2016/066723
PCT Pub. Date: May 6, 2016

(65) Prior Publication Data
US 2017/0338752 A1    Nov. 23, 2017

Related U.S. Application Data

(60) Provisional application No. 62/069,676, filed on Oct. 28, 2014.

(51) Int. Cl.
*H02N 2/00*    (2006.01)
*H01L 41/00*    (2013.01)
(Continued)

(52) U.S. Cl.
CPC ............... *H02N 2/12* (2013.01); *H01L 41/00* (2013.01); *H01L 41/09* (2013.01); *H01L 41/12* (2013.01);
(Continued)

(58) Field of Classification Search
CPC ............ H02N 2/12; H02K 99/20; H02K 1/06; H02K 21/02; H01L 41/00; H01L 41/09; H01L 41/12
(Continued)

(56) References Cited

U.S. PATENT DOCUMENTS 2,473,354 A * 6/1949 Benioff .................... B06B 3/00
367/156
2,837,668 A * 6/1958 Simpson .................. H03H 9/46
310/26

(Continued)

FOREIGN PATENT DOCUMENTS

CN    101350570 B    8/2013
JP    2007028881 A    2/2007

OTHER PUBLICATIONS

Geoffroy et al., "Practical and Theoretical Investigations of a Rotating Coilless Actuator Using the Inverse Magnetostrictive Effect," IEEE Transactions on Magnetics, Feb. 1, 2010, pp. 606-609, vol. 46, No. 2.
(Continued)

*Primary Examiner* — Thomas M Dougherty
(74) *Attorney, Agent, or Firm* — Workman Nydegger

(57) ABSTRACT

A stator or a rotor for use in an electrical machine comprises a composite element having a rigid mass suitable for including at least one magnetostrictive electrode bar, at least one magnetostrictive electrode bar, and a piezoelectric material in between the rigid mass material and the magnetostrictive electrode bars. The rigid mass, the magnetostrictive elec-
(Continued)

trode bars and the piezoelectric material are arranged such that applying a voltage between the rigid mass and one or more magnetostrictive electrodes, causes piezoelectric effects in the piezoelectric material inducing stress in the bi-axial plane of the at least one magnetostrictive bar and an altered permeability of the at least one magnetostrictive bar in a direction perpendicular to the bi-axial stress plane.

15 Claims, 18 Drawing Sheets

(51) Int. Cl.
  *H02N 2/12* (2006.01)
  *H02K 99/00* (2014.01)
  *H01L 41/09* (2006.01)
  *H01L 41/12* (2006.01)
  *H02K 1/06* (2006.01)
  *H02K 21/02* (2006.01)

(52) U.S. Cl.
  CPC ............... *H02K 1/06* (2013.01); *H02K 21/02* (2013.01); *H02K 99/20* (2016.11)

(58) Field of Classification Search
  USPC .................................. 310/26, 311, 328, 365
  See application file for complete search history.

(56) References Cited

U.S. PATENT DOCUMENTS

| | | | | |
|---|---|---|---|---|
| 4,520,413 | A | * 5/1985 | Piotrowski | G11B 5/58 257/225 |
| 2008/0169717 | A1 | 7/2008 | Takashima et al. | |
| 2016/0005949 | A1 | * 1/2016 | Lynch | G11C 11/1675 365/157 |

OTHER PUBLICATIONS

International Search Report for corresponding International PCT Application No. PCT/EP2015/075048, dated Jan. 19, 2016.
Wang et al., "PMN-PT Single Crystal and Terfenol-D Alloy Magnetoelectric Laminated Composites for Electromagnetic Device Applications," Journal of the Ceramic Society of Japan, Jan. 1, 2008, pp. 540-544, vol. 116, No. 4.

\* cited by examiner

ELECTRICAL MACHINES

FIELD OF THE INVENTION

The invention relates to the field of electrical machines. More particularly, the present invention relates to efficient electrical machines providing low power.

BACKGROUND OF THE INVENTION

Small electromechanical machines are very often used in mechatronic systems. A mechatronic system is required to be flexible and typically controls several internal sub-systems. The most common example is the control of a multi-shaft motion with a variable speed. The traditional solution uses a gear train where the speed, torque and direction of rotation are determined by a single motor and by the gear rated parameters. In a mechatronic solution, each shaft is controlled by its own electronically controlled motor, giving a higher flexibility and a higher efficiency. Such mechatronic systems are found in quartz watches, mobile phones, computers, (automatically guided) vehicles, industrial robots . . .

Manufacturers of computer hardware, automotive applications, office equipment, medical equipment, instrumentation for measurement and control, robots and handling systems are the main purchasers of small motors. Especially, small permanent magnet (PM) motors are frequently used. In 2002, the world production of PM motors was estimated to be 4.68 billion units (with a value of 38.9 billion U.S. $). In a car, for example, the number of small motors can run up to one hundred. Small PM brushless motors are e.g., used in hard disk drives and cooling fans of computers. In 2002, the worldwide production of computers was estimated to be 200 million units and the production of hard disk drives was approximately 250 million units.

The working principle of electrical machines and actuators relies upon the presence of a magnetic field that depends on both time and space. The most straightforward realisation thereof is by a set of AC current-carrying coils, for which the time-dependence is obtained by the alternating current and the spatial dependence is obtained by the spatial dislocating of multiple coils. By convention, a small electrical machine or actuator has a mechanical power below 1 kW. Energy efficiency is one of the most important performance indicators of an electromechanical machine. Although today the efficiency is high for high-power machines, the efficiency decreases rapidly for lower-power machine. The lower the power range, the lower the absolute value of the power losses, which is why one becomes ignorant about the lower efficiency. However, in view of the increasing number of small machines used, even small losses become significant.

The lower the mechanical power, the lower the expected/required efficiency. The low efficiency of the small electrical machines originates mainly from the fact that the stator Joule losses relative to the mechanical power increase. The latter can for example be seen in FIG. L1 illustrating the different losses occurring in an electrical machine. The stator Joule losses are the dominating losses in the low power range. This is also acknowledged in the new machine efficiency standard, introduced in 2008, specifying the IE1, IE2, IE3 and IE4 classes. From the 1st of January 2017, all new electrical machines beyond 0.75 kW must comply to the IE3 requirement with some exceptions.

There is a need for electrical machines providing low power in an efficient way.

SUMMARY OF THE INVENTION

It is an object of embodiments of the present invention to provide efficient electrical machines for providing low power.

It is an advantage of embodiments of the present invention that the electrical machines make use of permanent magnets in combination with the Villari effect to adaptively change the magnetic properties of the magnetic path and that in this way the time dependent and spatially dependent magnetic field is obtained. Since this principle eliminates the need of an alternating current fed to a coil, standard Joule losses can be avoided.

It was surprisingly found that using permanent magnets, sufficient amount of electrical power can be converted into mechanical power by changing the magnetic properties of a magnetic path using the Villari effect. It was also surprisingly found that a sufficient power density could be obtained with a device using such principle.

The above objective is accomplished by a method and device according to the present invention.

The present invention relates to a stator or a rotor for use in an electrical machine, the stator or rotor comprising a composite element comprising a rigid mass suitable for comprising at least one magnetostrictive electrode bar, at least one magnetostrictive electrode bar, and piezoelectric material in between said rigid mass material and said at least one magnetostrictive electrode bar, wherein the rigid mass, the at least one magnetostrictive electrode bar and the piezoelectric material are arranged such that applying a voltage between the rigid mass and one or more magnetostrictive electrodes, causes piezoelectric effects in the piezoelectric material inducing stress in the bi-axial plane of the at least one magnetostrictive bar and a change of the permeability of the at least one magnetostrictive bar in a direction perpendicular to the bi-axial stress plane.

The at least one magnetostrictive electrode bar may be a plurality of magnetostrictive bars. Alternatively embodiments of the present invention can mutatis mutandis be implemented with a single magnetostrictive bar. It is an advantage of embodiments of the present invention that in electrical machines making use of such a stator or rotor a high power density can be reached. It is an advantage of embodiments of the present invention that a good electric machines is provided that does not require electrical coils. It is an advantage, especially for small electrical machines, that the losses, e.g. stator Joule losses, can be eliminated by not using electrical coils. It is an advantage of embodiments of the present invention that miniaturisation of the electrical machines can be performed, whilst keeping a good efficiency. It is an advantage of embodiments of the present invention that machines having a power output smaller than 1 kW can still be provided with a good efficiency.

It is an advantage of embodiments of the present invention that the design and construction of electrical machines using such a rotor or stator is relatively simple since (besides cylindrical machines) linear or planar electrical machines and actuators can be provided.

It is a advantage of embodiments of the present invention that electrical machines can be provided wherein the voltage level can be independent of the speed of rotation.

It is an advantage of embodiments of the present invention that they can be used as energy harvesting machines.

It is an advantage of embodiments of the present invention that electrical machines and actuators are provided that comply with recently introduced machine efficiency standards.

The stator or rotor may be more particularly a stator. In case the composite element is used in a rotor, the required electrical power may for example be delivered using brushes. Other elements may be implemented mutatis mutandis with reference to the stator embodiments described below.

The piezoelectric material may be applied as piezoelectic layers surrounding the magnetostrictive materials. It is an advantage of embodiments of the present invention that the required voltage levels can be limited. The thickness of the piezoelectric material advantageously is as small as possible so that the area does mostly consist out of magnetostrictive material, so that the magnetic flux density is decreased for a the same magnetic flux delivered by the flux source. The piezoelectric layer thickness may be determined by the strain of the magnetostrictive electrode and the upper limit of the allowed voltage. If one uses an electric field of 130 MV/m in the chosen piezoelectric material, selection of a thickness of 20 µm between two electrodes leads to a voltage of +1300V and −1300V. The chosen thickness between an electrode and the rigid mass (having a zero potential) is 10 µm to obtain the same electric field. It is an advantage of embodiments of the present invention that for inducing the magnetisation, the electric field can be applied locally. It is an advantage of embodiments of the present invention that the voltages that are applied can be easily controlled and measured. It is an advantage of embodiments of the present invention that the design results in the possibility of reducing stringent requirements on the piezoelectric materials used and the requirements of creating a sufficiently long magnetic path.

The piezoelectric materials may be mechanically and electrically connected with the magnetostrictive material and the rigid mass.

The piezoelectric materials may be any of ceramics or electro-active polymers. It is an advantage of embodiments of the present invention that the particular shapes wherein the piezoelectric materials need to be present in the design can be obtained using one or a combination of electrophoretic deposition or solvent casting. It is an advantage of embodiments of the present invention that using thin piezoelectric materials result in a larger fraction of active magnetic materials in the composite material.

The rigid mass may be a single piece rigid mass wherein a plurality of magnetostrictive elements are used. It is an advantage of embodiments of the present invention that a good rigidity of the rigid mass is obtained, resulting in the possibility to minimally deform the magnetostrictive bars that are used. The lower the mechanical deformation, the higher the generated mechanical stress is of the piezoelectric material and this allows for to a thinner piezoelectric layer. To obtain a smaller deformation in the magnetostrictive electrodes, requires a stiffer electrode, mostly leading to a smaller section. By using a biaxial stress, meaning a stress in two directions, the strain in x and y direction is also smaller, leading to a smaller deformation. This is because a piezoelectric material wants to change in size when an electric field is applied. Due to the rigid mass and the stiffness of the electrodes, the piezoelectric material is restricted to deform which generates in the mechanical stress generation.

The plurality magnetostrictive bars may be arranged in an array. It is an advantage of embodiments of the present invention that the composite material shows symmetries resulting in a good or optimal packing. Another advantage of a symmetric arrangement is that it allows to work with a positive and negative voltage, which allows to divide the required voltage in two, leading to a thinner insulation package.

Some or all of the magnetostrictive electrodes may be electrically interconnected. It is an advantage of embodiments of the present invention that some or all of the magnetostrictive electrodes may be electrically interconnected, e.g. in contact with each other, as this renders the electrical connection more easy. This electric interconnection may be designed in such a way that no additionally eddy current can flow through the interconnection. This is obtained by avoiding closed loops with the interconnections and only use division of the main connections.

The magnetostrictive bars may be elongated bars.

The magnetostrictive bars may be cylindrical bars.

The magnetostrictive bars may be elongated bars and may having a triangular shaped cross-section.

The magnetostrictive bars may be elongated bars having a rectangular shaped cross-section.

The magnetostrictive bars may be elongated bars having a hexagonal shaped cross-section.

The composite material may be designed such that the distance between the rigid mass and the adjacent magnetostrictive bars is equal to or smaller than half the distance between two adjacent magnetostrictive bars.

The rigid mass and/or the piezoelectric materials may be non-magnetic. It is an advantage of embodiments of the present invention that the percentual change in reluctance that is obtained using the bi-axial stresses can be high or optimised.

The rigid mass may comprise a material that is electrically conducting and mechanically rigid. It is an advantage of embodiments of the present invention that INOX can be used for forming the rigid mass. Different types of materials that are not magnetic can be used, such as for example paramagetic materials or antiferromagnetic materials or diamagnetic materials. The materials advantageously have a high Young modulus and are electrically conducting. Specific examples are chromium, tungsten, molybdenum, alloys of steel forming non-magnetic materials, etc. It is an advantage of some embodiments that the rigid mass comprises alignment features, e.g. alignment taps, are provided that allow aligning elements, e.g. insulation plates when used, with respect to the rigid mass.

The stator or rotor may furthermore comprise electrical connectors for alternatingly connecting different magnetostrictive bars to outside electrical sources. In some embodiments the electrical connectors may be designed as electrical fingers. It is an advantage of some embodiments of the present invention that the electrical connectors not only provide connection of the magnetostrictive bars to the outside electric sources, but also provide guidance of the magnetic flux to the permeable magnetostrictive bars thus embedding the composite in the surrounding magnetic path. In some embodiments, the finger electrodes may be made of a ferromagnetic and conducting material such as for example steel.

The electrical connectors may be grouped such that, in use, the magnetostrictive electrodes under positive voltage and under negative voltage form a checkerboard pattern. The magnetostrictive electrodes belonging to the same group may alternatively also be interconnected with each other. Such interconnection may occur along the length of the bars or at one side of the bars.

The stator or rotor furthermore may comprise insulation plates for insulating the magnetostrictive material from the rigid mass. The insulation plates may typically be made of non-conducting and non-permeable material. The insulation plate may for example be made of teflon or glass or more generally ceramic materials. In some embodiments, the system also may comprise cover plates for covering the composite material. Such cover plates also may be used as axial bearing.

In one aspect, the present invention also relates to an electrical machine comprising a stator or rotor as described above. It is an advantage of embodiments of the present invention that the design results in a good mechanical stability of the composite material, i.e. that the piezoelectric materials, the magnetostrictive materials and the rigid mass show and maintain a good adhesion. It is an advantage of embodiments of the present invention that in the current design, the piezoelectric material only exerts a tension when it is already submitted to an electrical field. In some embodiments, the adhesion may be assisted by Coulomb forces between the charges at the electrodes (magnetostrictive bars and rigid mass) and the induced charges in the piezoelectric material.

The electrical machine may be a permanent-magnet variable reluctance machine.

In one aspect, the present invention also relates to a composite element comprising a rigid mass suitable for comprising at least one magnetostrictive electrode bars, at least one magnetostrictive electrode bars, piezoelectric material in between said rigid mass material and said magnetostrictive electrode bars, wherein the rigid mass, the at least one magnetostrictive electrode bar and the piezoelectric material are arranged such that applying a voltage between the rigid mass and one or more magnetostrictive electrodes, causes piezoelectric effects in the piezoelectric material inducing stress in the bi-axial plane of the at least one magnetostrictive bar and an altered permeability of the magnetostrictive bars in a direction perpendicular to the bi-axial stress plane. The altered permeability may be a diminished permeability. The at least one magnetostrictive bar may be a plurality of magnetostrictive bars.

The piezoelectric material may be applied as piezoelectric layers surrounding the magnetostrictive materials.

The piezoelectric materials may be mechanically and electrically connected with the magnetostrictive material and the rigid mass.

The piezoelectric materials may be any of ceramics or electro-active polymers.

The rigid mass may be a single piece rigid mass wherein a plurality of magnetostrictive elements are used.

The plurality of magnetostrictive bars may be arranged in an array.

The magnetostrictive bars may be elongated bars.

The magnetostricitve bars may be cylindrical bars.

The magnetostrictive bars may be elongated bars having a triangular shaped cross-section.

The magnetostrictive bars may be elongated bars having a rectangular shaped cross-section.

The magnetostrictive bars may be elongated bars having a hexagonal shaped cross-section.

The composite material may be designed such that the distance between the rigid mass and the adjacent magnetostrictive bars is equal to or smaller than half the distance between two adjacent magnetostrictive bars.

The rigid mass and/or the piezoelectric materials may be non-permeable.

The rigid mass may comprise a material that is electrically conducting and mechanically rigid.

The composite element furthermore may comprise electrical connectors for alternatingly connecting different magnetostrictive bars to outside electrical sources.

Some of the electrical connectors may be grouped such that, in use, the magnetostrictive electrodes under positive voltage and under negative voltage form a checkerboard pattern.

The composite element may furthermore comprise insulation plates for insulating the magnetostrictive material from the rigid mass.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
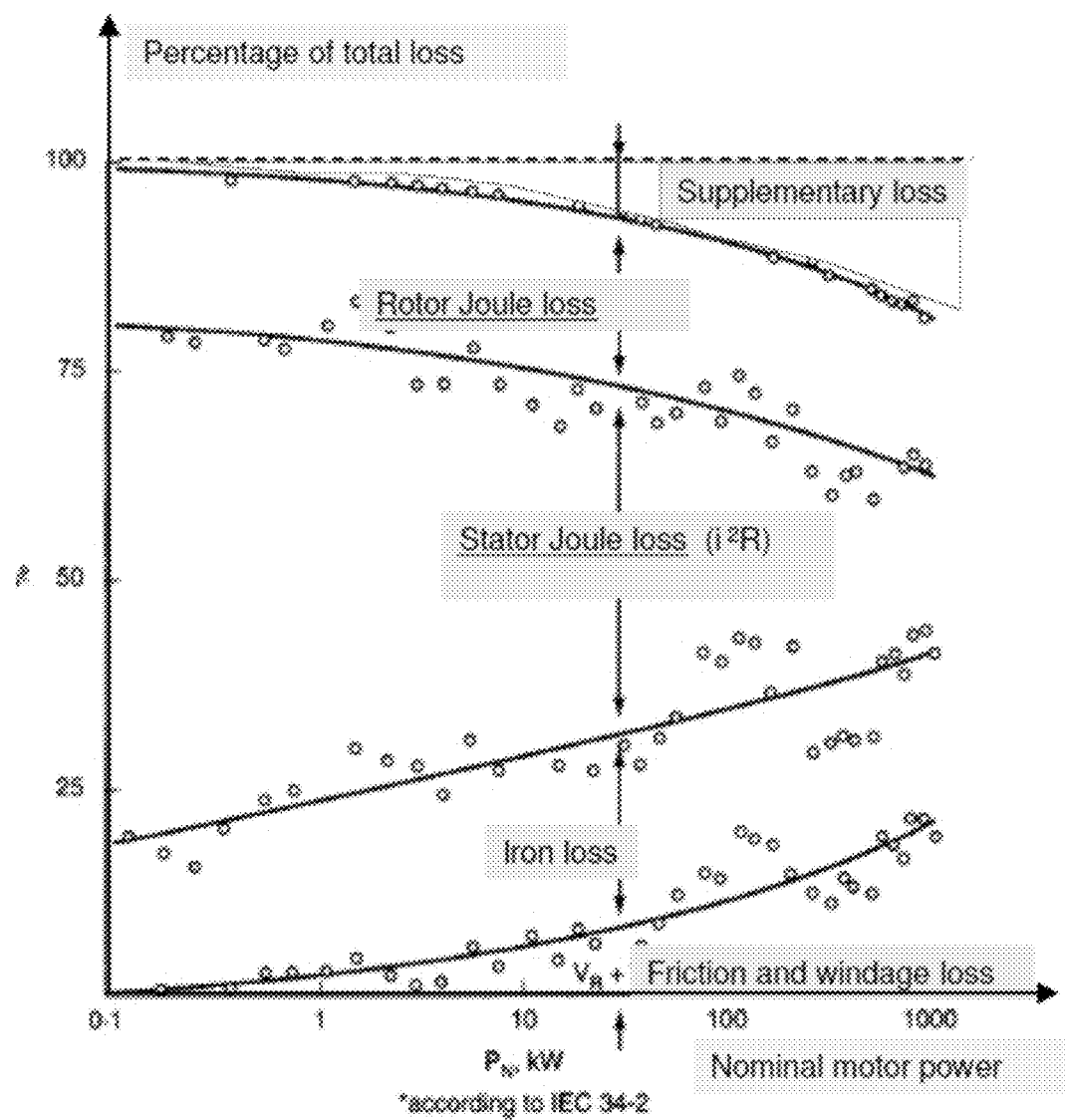
FIG. 1 illustrates an overview of the losses occurring in an electrical machine, as known from prior art.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Figure 25:
FIG. 25 illustrates a set of helically shaped magnetostrictive bars, as can be used in embodiments according to the present invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where reference is made to magnetostrictive electrode bars, reference is made to magnetostrictive electrodes that extend in a direction wherein the flux flows. The electrodes do not need to follow a straight line, e.g. may have the form of a helix electrode. By way of illustration, an example of such magnetostrictive bars is illustrated in FIG. 25. It is to be noticed that, where reference is made to a plurality of magnetostrictive bars, reference also may be made to a set of magnetostrictive bars that is at one or more sides interconnected with each other.

Embodiments of aspects of the present invention make use of the Villari effect. By way of illustration, embodiments of the present invention not being limited thereto, the principles behind the Villari effect will first be described. The Villari effect is also known as the inverse magnetostrictive effect. All ferromagnetic materials exhibit magnetostriction, meaning that a sample changes in length when submitted to a magnetic field. Before explaining the Villari effect, first the magnetostrictive effect will be explained. A ferromagnetic material consists of many magnetic domains, which are regions of uniform magnetization. In a ferromagnetic piece of material without remanence, all magnetic domains are randomly oriented. In a crystalline ferromagnetic material, the magnetic domains are oriented with respect to the crystal lattice but still in a random way such that the magnetization adds up to zero. In a crystal lattice, there are three types of magnetic axes: the easy axes, the medium axes and the hard axes. The easy axes are the axes along which the magnetization is easy, while the hard axes are the axes along which the magnetization is difficult, and thus requires more energy. The easy axes thus constitute the preferred magnetization directions of the magnetic domains. The situation whereby the magnetic domains are randomly oriented in fact corresponds to the situation whereby the magnetic domains are equally distributed over the easy axes in such a way that the global magnetization is zero. Due to the spontaneous magnetization and spin-orbit coupling, the electron cloud will take the shape of an ellipsoid, leading to a minimum and maximum length which are fixed to the direction of the magnetisation. Due to this reason, the dimensions of the magnetic domains change when the magnetization of the magnetic domain change, for example due to the applied magnetic field. This introduces the change in length on a macroscopic scale of the ferromagnetic sample, which explains the effect of magnetostriction.

The Villari effect is the inverse magnetostrictive effect and explains the relationship between the mechanical stress and the permeability. The permeability expresses how easy or how difficult it is to align the magnetic domains in a certain direction. Because a ferromagnetic material has preferred magnetization directions, the permeability also depends on the direction (anisotropy). One experiences the Villari effect when one applies a stress and thereby influences on the size of the crystal lattice. For example, when applying a tension on a ferromagnetic material along an easy axis, the size of the sample changes. The length of the sample will increase in the direction of the tension and decrease in the perpendicular directions due to the Poisson effect. To reduce the internal energy of this material, the magnetic domains will align axis of maximum length with the direction of the tension. If the magnetization direction is aligned with the maximum length direction of the magnetic domains, the specimen has only one easy axis left. This means that the permeability would increase in the direction of the tension and decrease in the other directions. The opposite occurs if the magnetization direction of a magnetic domain is aligned with a minimum length direction of that magnetic domain. The application of stress has a significant change in permeability. The energy differences stored in the material are strongly effected by different levels of applied biaxial stresses to the material. The stored magnetic energy becomes larger when the magnetic induction is larger, with the assumption that the stress remains constant, and when the mechanical stress is larger, with the assumption that the induction remains constant. The difference in stored magnetic energy between the situation where no biaxial stress is applied and the situation where a biaxial stress is applied (for example 30 MPa) also increases with increasing induction. Here, the assumption has been made that the inductions are the same in both situations, until saturation starts to occur in one of both situations.

Figure 2:
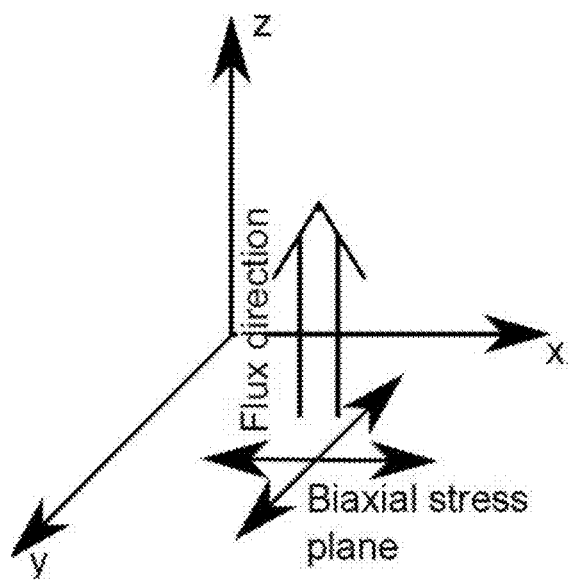
FIG. 2 illustrates an overview of the orientation of the stress plain and the magnetic flux direction, as used in embodiments according to the present invention.

In a first aspect, the present invention relates to a stator or a rotor for use in an electrical machine, the stator or rotor comprising a composite element. Such a composite element comprises a rigid mass suitable for comprising a plurality of magnetostrictive electrode bars, a plurality of magnetostrictive electrode bars, and a piezoelectric material in between said rigid mass material and said magnetostrictive electrode bars. The rigid mass, the magnetostrictive electrode bars and the piezoelectric material thereby are arranged such that applying a voltage between the rigid mass and one or more magnetostrictive electrodes, causes piezoelectric effects in the piezoelectric material inducing stress in the bi-axial plane of the magnetostrictive bars and a altered, e.g. diminished, permeability of the magnetostrictive bars in a direction perpendicular to the bi-axial stress plane. The design is inherently three-dimensional. FIG. 2 shows the definitions of the magnetic-flux direction with respect to the biaxial stress plane. The biaxial stress plane is the plane in which the applied stresses of the piezoelectric material acts on the magnetostrictive material. According to embodiments of the present invention, the biaxial stress plane is taken perpendicular on the magnetic-flux direction. In other words, in embodiments of the present invention that materials and elements in the composite element are arranged such that the biaxial stress plane is perpendicular to the magnetic flux direction.

Figure 3:
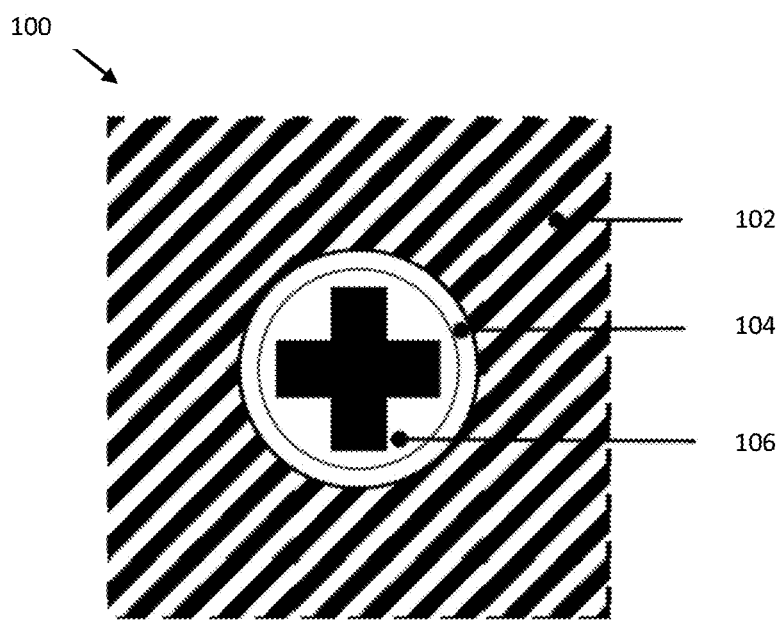
FIG. 3 illustrates the different components of a composite element, as used in embodiments according to the present invention.
Figure 4:
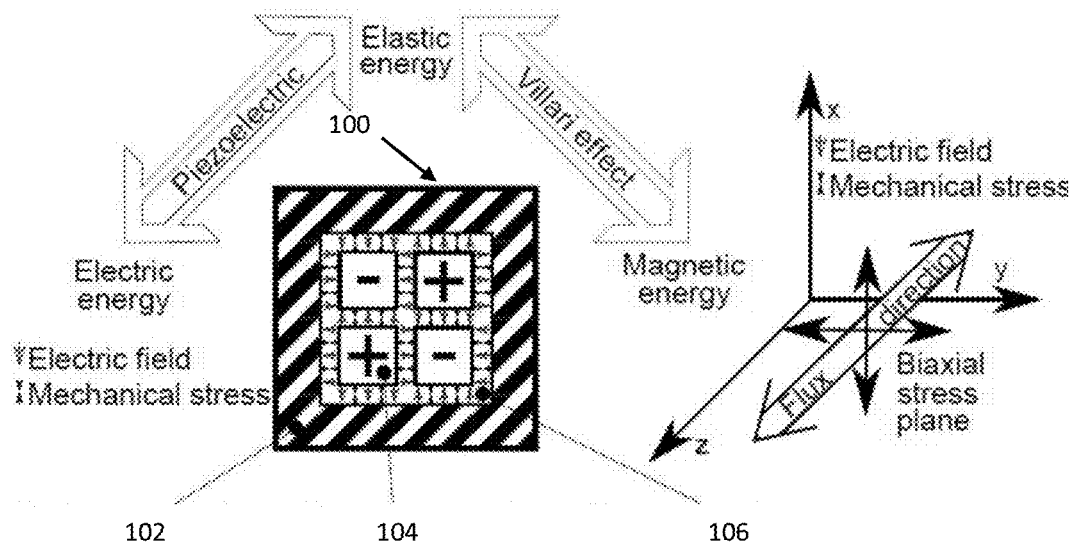
FIG. 4 illustrates a composite element and the different effects that are used in embodiments according to the present invention.

As indicated above, according to embodiments of the present invention, a bi-axial stress is obtained by a dedicated smart-composite topology. By way of illustration, embodiments of the present invention not being limited thereto, an example of such a topology is shown in FIG. 3 and FIG. 4. FIG. 3 shows a zoomed in part illustrating the basic elements of the composite element, whereas FIG. 4 illustrates, in a cross-section along the biaxial stress plane, an exemplary topology with the different effects playing a role when using the composite element. The composite element 100 is shown comprising a rigid mass 102, a piezoelectric material 106 and one or more magnetostrictive bars 104.

As can be seen in FIG. 4, the composite element 100 has a conducting rigid mass 102 (electrically conducting mass) and a number of inset bars 104 of magnetostrictive material. Thin layers of piezoelectric material 106 are arranged between the rigid mass and the bars 104. The magnetostrictive bars 104 are also highly conductive and serve as a set of electrodes. In general, the following three constituents and their functioning are distinguished:

1) The rigid mass 102 is electrically conducting, mechanically stiff and magnetically non-permeable. This part may have magnetostrictive properties as long as these oppose the magnetostriction of the magnetostrictive bars 104. The rigid mass is operated at ground potential. The geometry is deliberately symmetric. This part is preferably constructed out of a non-magnetic material, such as a paramagnetic, diamagnetic or anti-ferromagnetic material.

2) The magnetostrictive bars 104 are electrically conducting, mechanically stiff and feature a large magnetostriction. They have a high magnetic permeability unless a mechanical tension is applied. Then, they should feature a low permeability.

3) The piezoelectric layers 106 are positioned between the rigid mass 102 and the magnetostrictive bars 104. The geometry and assembly should be such that the piezoelectric layers have a constant thickness.

By way of illustration, embodiments of the present invention not being limited thereto, the principle of using the Villari effect as a method for actively controlling the flux of a magnetic source will be explained. It is to be noticed that embodiments of the present invention are not limited by theoretical concepts or principles, but only by the features and characteristics as claimed in the accompanying claim set.

The purpose is to use in electrical machines the locally generated mechanical stress in such a way that the magnetic properties of the material changes accordingly. The needed mechanical stress is generated by a piezoelectric material 106. A smart composite combining magnetostrictive and piezoelectric material 106 is conceived, such that the magnetization of the magnetostrictive material is controlled by applying an electric voltage/field to the piezoelectric material 106. The smart composite is inherently three dimensional, but features many symmetries. Before digging into the design, the advantages of applying an electric field to a piezoelectric material 106 (instead of a current in a coil) are highlighted:

an electric field can be applied locally;
voltages are easy to control and to measure;
the use of voltages allows to realize dynamic and efficient systems.

Applying a stress to a piezoelectric-magnetostrictive composite modifies the magnetic anisotropy of the composite, results in a change of the permeability of the composite and leads to a change of the reluctance of the magnetic path through the piece. Because the composite will be used in energy conversion designs (inductors, electrical machines, actuators, relays, . . . ), rather than in electronic designs, high values for the electric and magnetic fields are to be expected. This implies that the composite material preferably has a large saturation induction and a high permeability. These requirements necessitate to focus on an anisotropic controllable ferromagnetic composite, which excludes some magnetostrictive materials.

The working principle of this smart composite does not rely on a direct interaction between the magnetic moment and the electrical dipole moment, but relies on an indirect interaction along the mechanical stresses. The piezoelectric material component generates a mechanical strain and a mechanical stress when an electric field is applied to the composite material. This stress is experienced by the magnetostrictive material component and changes its crystal structure. The crystal structure determines the behaviour of the magnetostrictive material. More precisely, the crystal structure determines the easy axes of magnetization. An easy axis is a preferred direction for the magnetic domains in the crystal structure, without having an impact on the sense of the magnetic moments (which implies that this approach is not suitable for data storage). By controlling the easy axes, also the hard axes (directions in the crystal structure with which the magnetic domains do not prefer to be aligned) are controlled. The Villari effect is a macroscopic description of the influence of an uni-axial stress on the magnetic properties of a material:

for a material with positive magnetostriction, an uni-axial tension will increase the number of aligned magnetic domains in the direction of this uni-axial tension and will decrease the number of aligned magnetic domains in all other directions. for a material with negative magnetostriction, an uni-axial tension will decrease the number of aligned magnetic domains in the direction of this uni-axial tension and will increase the number of aligned magnetic domains in all other directions.

The 3D composite element allows to apply a bi-axial stress in the plane perpendicular to the magnetic flux. By applying a bi-axial tension in the perpendicular plane, the easy axes align with the plane (for a magnetic material with positive magnetostriction). The easy axis, which is originally in the direction of magnetic flux, gradually turns over into a hard axis. When the tension is sufficiently high, the easy axis, which is in the direction of magnetic flux, completely disappears, leading to a small permeability.

Although many different embodiments can be implemented according to the aspect of the present invention, some particular embodiments will be discussed in more detail, illustrating some optional features of embodiments of the present invention.

In embodiments of the present invention, the rigid mass 102 advantageously has a sufficient rigidity in order to maximally deform the magnetostrictive bars 104. This is for example accomplished by using a single rigid mass and a large number of magnetostrictive bars 104. Such a single-piece rigid mass 102 can for example be obtained by casting, molding or microfabricating the rigid mass. Other techniques that can be used are chemical milling, electro milling or 3D printing. It is an advantage of embodiments of the present invention to use a single piece for the rigid mass 102. The stator bars can be directly aligned/positioned with each other.

In some embodiments of the present invention, the rigid mass 102 and/or the piezoelectric layers 106 are non-permeable in order to maximise the percentual change in reluctance exerted by the bi-axial stress.

In some embodiments, the thickness of the piezoelectric layers 106 is as small as possible in order to limit the needed voltage levels. In embodiments of the present invention, it is opted to apply a voltage difference and a bi-axial stress in a cross-sectional plane to obtain a change of reluctance in the perpendicular direction. The use of an axial stress (in the z-direction according to FIG. 2) would require an unmanageably large electric field in the z-direction. The choice for an electric field and a bi-axial stress in the cross-sectional plane in combination with a magnetic flux in the perpendicular direction allows to separate the requirement of thin piezoelectric layers (now aligned with the cross-sectional plane) and the requirement of a sufficiently long magnetic path (now aligned with the perpendicular direction).

Figure 5:
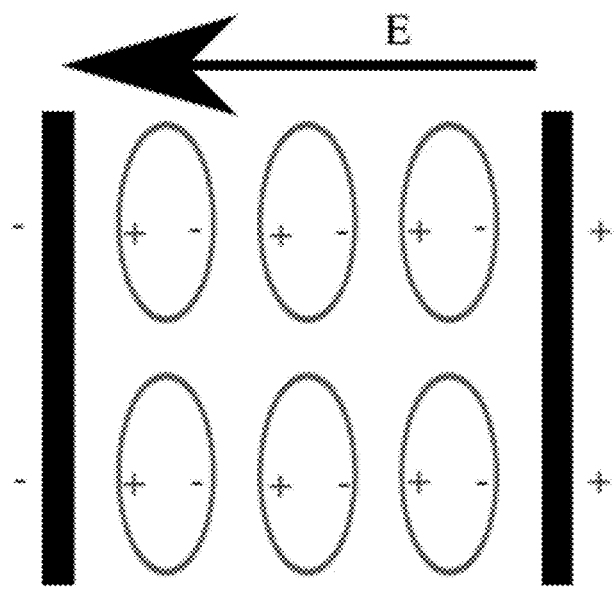
FIG. 5 illustrates the electrical forces that are used for positioning the different components of the composite element adjacent each other, as can be used in embodiments of the present invention.

In some embodiments, the piezoelectric materials can be glued to the magnetostrictive bars 104 and/or the rigid mass 102. It is to be noticed that, when the prescribed voltage is applied, the piezoelectric material 106 exerts a tension of 25 N/mm$^2$. This value is well beyond the stress that can be withstood by a high quality glue between two surfaces. Whereas it would be expected that the adhesion between the piezoelectric layer and the magnetostrictive bars 104 and rigid mass 102 gets lost, there is no problem with the adhesion between the piezoelectric material 106 and the magnetostrictive bars 104. It is believed that, since the piezoelectric material 106 only exerts a tension when already submitted to an electric field, the Coulomb forces between the charges at the electrodes (magnetostrictive bars 104 and rigid mass 102) and the induced charges in the piezoelectric material 106 provide a sufficient adhesion. The latter is illustrated in FIG. 5. Moreover, it is assumed that these attraction forces are much stronger than the forces introduced by the piezoelectric effect.

According to embodiments of the present invention, the magnetostrictive bars 104 may only interact with the rigid mass 102. In other embodiments, the magnetostrictive bars 104 may interact with the rigid mass 102 and may interact mutually.

Whereas above some examples are already shown for topologies for the magnetostrictive bars 104 and the piezoelectric material 106 and the rigid mass 102, additionally some particular examples will be further discussed.

Figure 6A:
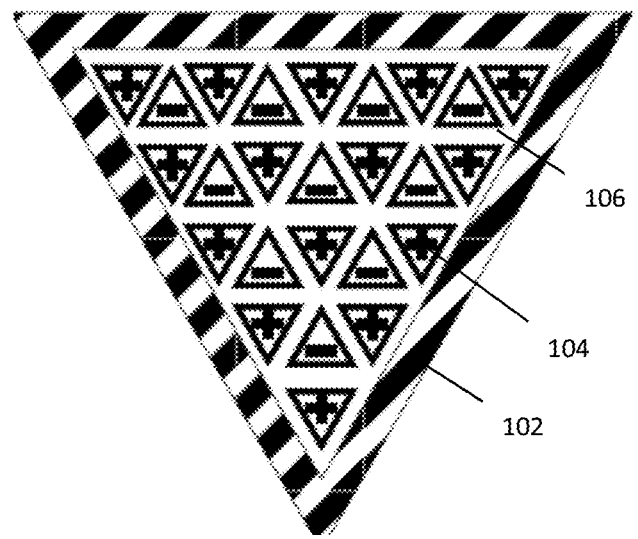
FIGS. 6A, 6B and 6C illustrate different topologies for the composite element, as can be used in embodiments of the present invention.

In some embodiments, triangular shaped magnetostrictive bars 104 are used. In such a topology, the magnetostrictive bars 104 can be put under both positive and negative voltages. A schematic representation is shown in FIG. 6A. In this figure, the rigid mass 102, the piezoelectric layer 104 and the magnetostrictive bars 104 are shown. The magnetostrictive bars 104 having a + sign are put on a positive voltage whereas the magnetostrictive bars 104 with a minus sign are put on a negative voltage. In the example shown, the magnetostrictive bars 104 are spatially distributed such that adjacent magnetostrictive bars 104 are put on a different voltage.

Figure 6B:
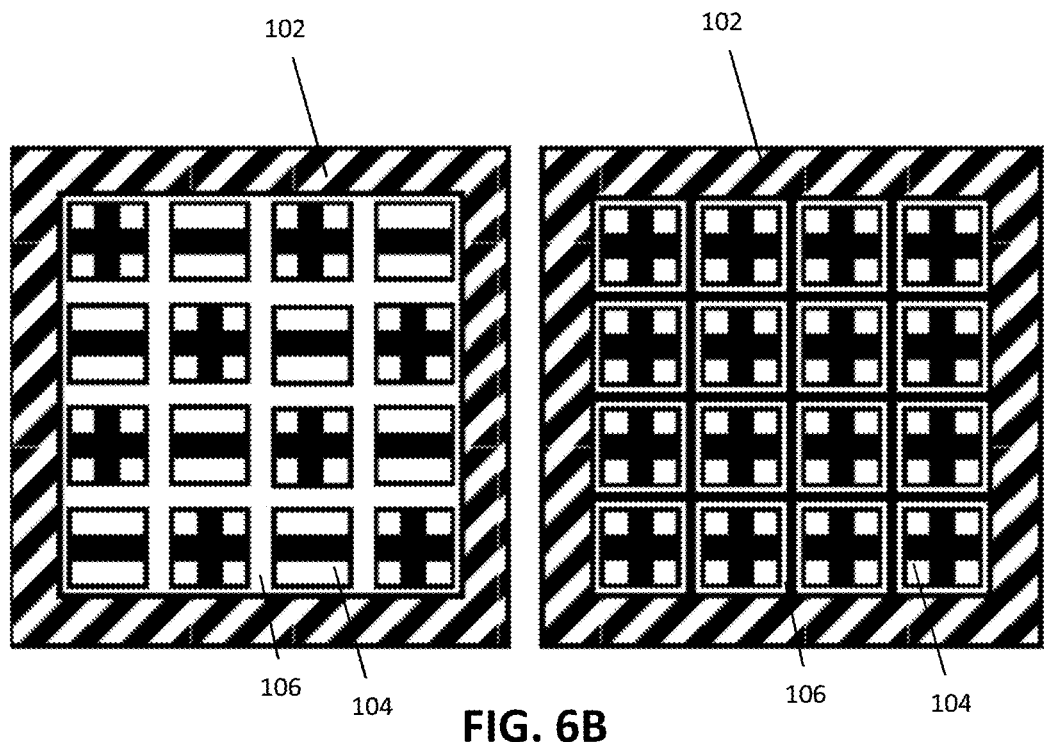

FIG. 6B illustrates two designs wherein rectangular magnetostrictive bars 104 are used. Again the rigid mass 102, the piezoelectric layer 104 and the magnetostrictive bars 104 are shown. In the example on the left hand side, different magnetostrictive bars 104 are put on a different voltage (positive for some, negative for others) such that adjacent magnetostrictive bars have opposite sign. On the left hand side, an example is shown whereby the magnetostrictive bars are put on the same voltage (all being a positive voltage in the present example).

Figure 6C:
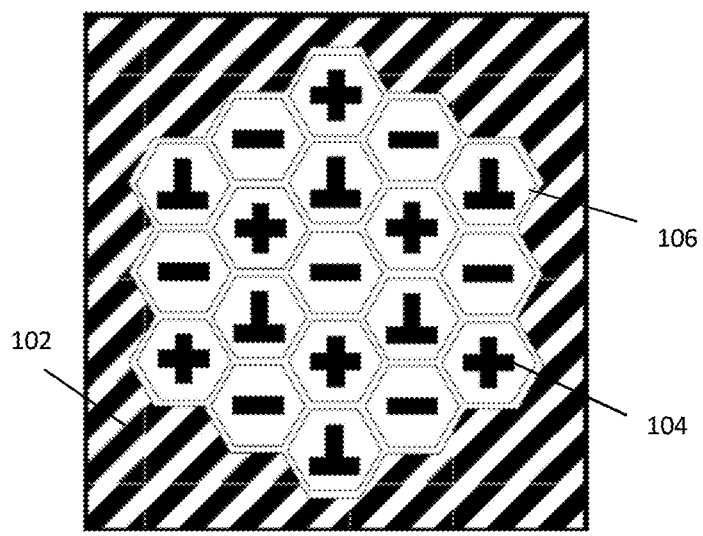
Figure 7:
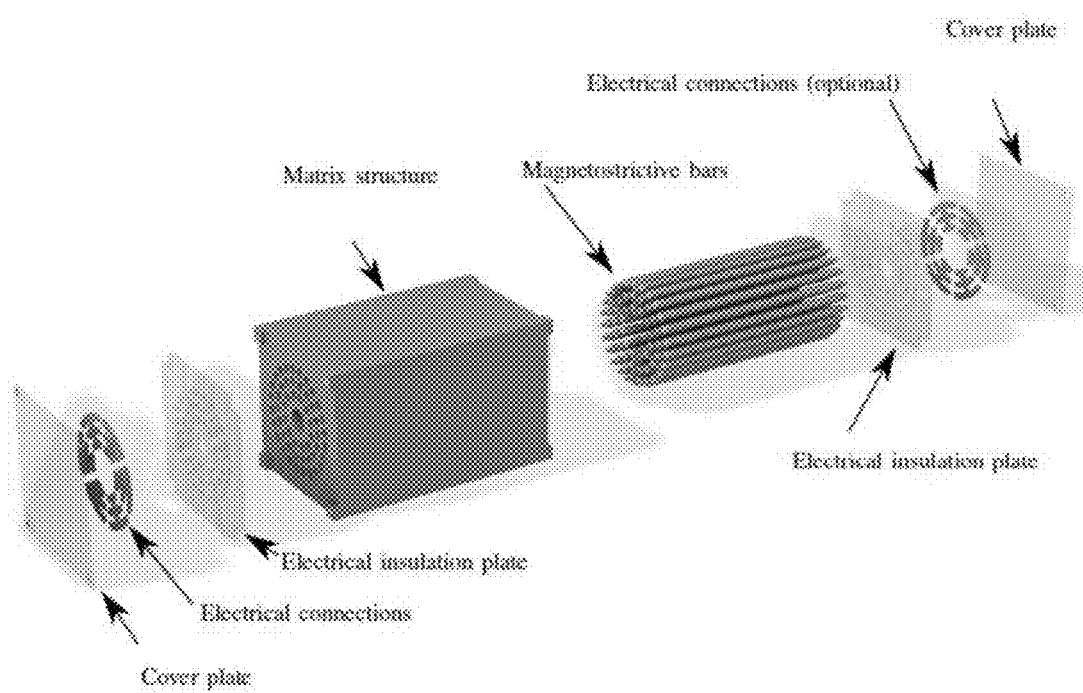
FIG. 7 illustrates the different components of a composite element as used in an exemplary prototype according to an embodiment of the present invention.

In FIG. 6C an example is shown of a composite element 100 having a rigid mass 102, peizoelectric material 104 and hexagonal shaped magnetostrictive bars. When using hexagonal magnetostrictive bars, several configurations can be used. Where the bars interact with each other, some of the bars are put on a zero voltage (indicated with an inverted T sign), whereas others are put on a positive voltage and still others are put on a negative voltage. Typically, in such a case all piezoelectric layers may have an equal thickness. The electric field will be different. For example, for the case with the hexagonal magnetostrictive bars, the electric field strength between a magnetostrictive bar with a zero voltage and a magnetostrictive bar with positive or negative voltage is half from the electric field strength between a magnetostrictive bar with a positive voltage and a magnetostrictive bar with a negative voltage. Not only the electric field strength between two magnetostrictive bars can be different, but also the electric field strength between a magnetostrictive bar and the rigid mass 102 can be different. In order to avoid different tensions and different permeabilities, some examples with triangular shaped magnetostrictive bars and some examples with rectangular shaped magnetostrictive bars may be preferred. Different tensions and different permeabilities may for example be avoided, e.g. in case of triangular magnetostrictive bars, by putting the rigid mass 102 on a negative voltage or, e.g. in case of rectangular magnetostrictive bars, by selecting the distance between the rigid mass 102 and the adjacent magnetostrictive bars to be only half the distance between two adjacent magnetostrictive bars.

In a second aspect, the present invention relates to a composite element as such having the features and advantages of the composite element as described in the first aspect. The composite element does not necessarily be comprised in a stator or rotor. It can for example be used in small lifting magnets on positioning systems, small magnetic systems for charged particle deflection, small magnetic systems for filling or releasing nano magnetic particles, e.g. in drug dosimetry systems, linear and planar machines, electric controllable self-inductance (high power density) implemented in power electronic circuits, magnetic enhanced capacitors for electric storage, etc.

Figure 26:
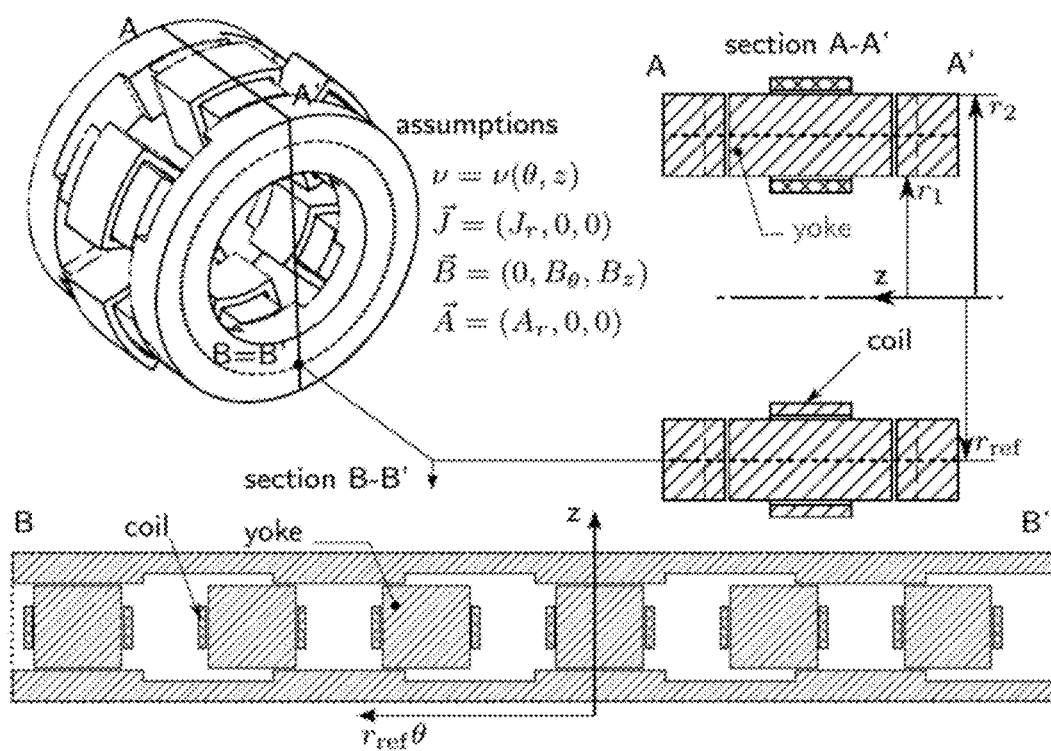
FIG. 26 illustrates a 3D model of an axial flux machine according to an embodiment of the present invention.

In a third aspect, the present invention relates to an electrical machine comprising a rotor or a stator according to embodiments of the first aspect of the present invention. The electrical machine may for example be a permanent magnet variable reluctance machine. The electrical machine may be a motor or an actuator. It will be understood that further elements of the electrical machine may correspond with conventional elements as known by the person skilled in the art. By way of illustration, embodiments of the present invention not being limited thereto, an exemplary 3D schematic representation of an axial flux machine according to an embodiment of the present invention is shown in FIG. 26.

In a fourth aspect, the present invention relates to a method for altering the reluctance of a composite structure. By way of illustration a possible working principle can be as follows. A voltage is applied between the rigid mass 102 and one or several of the magnetostrictive bars 104. As a result thereof, the piezoelectric layers shrink. It is to be noticed that piezoelectric material 106 with a negative piezoelectric coefficient are selected. Alternatively, also a material with a positive piezoelectric coefficient could be used in combination with a magnetostrictive electrode having a negative magnetostrictive coefficient. Due to the shrinking of the piezoelectric material 106 (assuming a sufficiently stiff rigid mass 102), the magnetostrictive bars 104 experience tension stresses and strains in the bi-axial plane. These stresses reduce the easy magnetization axis perpendicular to the bi-axial stress plane. In the perpendicular direction, the permeability of the magnetostrictive bars 104 diminishes and, by that, the reluctance of the composite structure increases. Furthermore, the present invention in one aspect also relates to the use of an electrical machine according to the third aspect for inducing a movement or actuation.

In a fifth aspect, the present invention relates to a method of inducing motion or actuation of an element, the element being in connection with an electrical machine comprising a stator and a rotor, one of said stator and rotor being according to a stator or rotor of an embodiment of the first aspect. The method comprises subsequently controlling different relative positions between the stator and the rotor by subsequently altering a voltage between the rigid mass 102 and one or several of the magnetostrictive bars 104 so as to induce a relative motion thus inducing shrinking of the piezoelectric material 106 and inducing stress in a bi-axial plane of the magnetostrictive bars 104 and a change of the permeability of the magnetostrictive bars 104 in a direction perpendicular to the bi-axial stress plane. The relative motion of the stator and the rotor causes the electrical machine to induce motion or actuation of an external element. For this induced motion or actuation transmission elements may be used to convert the stator/rotor movement to the motion or actuation of the external element. This conversion can be done using conventional conversion elements/techniques, known in the art.

By way of illustration, embodiments of the present invention not being limited thereto, simulation results for a prototype design will be further discussed, embodiments of the present invention not being limited thereto. Different standard and optional features will be discussed First the composite element used will be discussed in more detail. The composite element of the prototype example used, embodiments not being limited thereto, comprises the following elements:
1) the rigid mass 102,
2) several magnetostrictive bars 104, in FIG. 5 there are 54 magnetostrictive bars 104,
3) at least 6, preferably 12 electrical connections,
4) 2 electrical insulation plates,
5) 2 cover plates.

In the present example, the piezoelectric layers are thin layers between the magnetostrictive bars 104 and the rigid mass 102. The piezoelectric layers should be mechanically and electrically connected with the magnetostrictive bars 104 and the rigid mass 102.

In the present prototype, two types of piezoelectric materials, i.e., ceramics and electro-active polymers, are considered. In the present example, electrophoretic deposited ceramic material can be for example be used, providing the flexibility of providing the required shapes. The same technique can be applied when using piezoelectric polymers. Another known and widely used technique for providing the piezoelectric material 106 is the solvent casting technique. One or a combination of these techniques can be used.

Although the ceramic piezoelectric materials can generate a larger maximum stress, they have the disadvantage that the required thickness of the piezoelectric layers must be much higher. Indeed, the strains of these materials are an order of magnitude smaller than the strains of the piezoelectric polymers. Keep in mind that the strains of the piezoelectric ceramics are larger than the strains obtained by the magnetostrictive materials, but they have the same order of magnitude as for giant magnetostrictive materials. Due to the generated stress dependency on the strain of the piezoelectric material 106, as shown with $\sigma = Y\,(dE - \varepsilon)$, a large strain is preferable. This allows a thinner piezoelectric layer, which implies a larger fraction of active magnetic material in the piezoelectric-magnetostrictive composite. The voltage which must be applied to a piezoelectric-polymer layer is approximately two orders of magnitude larger than the one needed for its ceramic counterpart. This property is related to the observation that the energy storage in these materials is much higher and that piezoelectric materials store their energy as an electrostatic energy. At the moment, the permittivity for these materials is very low i.e., the relative permittivity is close to 12. By increasing this permittivity, a lower electric field would be needed to store the same amount of energy. Notice, however, that still a high electric field strength is needed since the stored electrostatic energy equals $$W = CU^2/2 = \varepsilon E^2 V/2$$

The stored energy is proportional with the square of the electric field, while the stored energy is proportional with the permittivity.

In the prototype design, a piezoelectric layer is brought around a magnetostrictive bar. In advantageous embodiments several magnetostrictive bars 104 are assembled within a single rigid mass 102, with each time a thin piezoelectric layer in-between. The piezoelectric layer around a magnetostrictive bar allows to exert a mechanical stress on the magnetostrictive bar. The cylindrical holes in the rigid mass 102 are slightly larger in diameter than the diameter 2R of the magnetostrictive bars 104, the difference being the thickness d of the piezoelectric layers. The electric field in the piezoelectric layer changes with an inverse proportionality of the radius and, hence, is not constant within the piezoelectric layer. For a sufficiently small thickness to radius ratio $d = R$, the electric strength can be considered as constant. The piezoelectric layers are only meant to apply a stress to the magnetostrictive bars 104. They do not contribute to the magnetic flux path, which is a second reason to keep them thin.

A piezoelectric material consist of many domains, each with a direction of polarisation. When a piezoelectric material 106 is moulded, the domains have no preferred direction. As a consequence, their net polarization is zero (this is the lowest energy level). To enable the piezoelectric effect, the domains have to be aligned in a specified direction. This alignment is obtained by applying a very high electric field strength. Such electric field strength is close to the breakdown electric field strength and is difficult to apply for a cylindrical piezoelectric layer. The proposed construction procedure allows to obtain the prescribed shape and to obtain the required direction of polarisation.

In the example further discussed, a piezoelectric polymer is used. By using a solvent casting technique, the polymer can be brought into the prescribed shape. When the solvent vaporizes, the piezoelectric material 106 becomes solid. As long as the solvent is in the piezoelectric material 106, the electric dipoles are free to move and can be aligned with a specific direction. By applying a voltage on the magnetostrictive bars 104 and the rigid mass 102, a radial electric field is generated. The electric dipoles in the piezoelectric material 106 align with the electrical field and are kept aligned by the electric field during the process of evaporating the solvent. When submersed in the solvent, the piezoelectric polymer does not yet has a crystal structure. As a consequence, aligning the electric dipoles can be done by a moderate electric field strength. When the polarisation would be carried out for an already crystalline piezoelectric polymer, a substantially higher electric field would be needed. The process of polarising the piezoelectric material 106 during the evaporation of the solvent has many similarities to the process of magnetising a matrix bonded permanent magnet.

The main disadvantage of the proposed polarisation process is the situation whereby the solvent needs to be vaporized while applying high voltages to the electrodes. A second disadvantage is the fact that gas inclusions may arise when the solvent vaporizes. Such holes in the piezoelectric layer are particularly dangerous because they would lead to electric discharges during the operation of the piezoelectric layers. This problem can be solved by using an additional reservoir on top of the mould. This allows to use 110% of the piezoelectric polymer and solvent. On top of the mould, i.e., in the reservoir, the solvent is vaporised at a sufficient slow rate. This allows a diffusion of the solvent from the bottom to the top of the mould implying an equal concentration across the cylindrical volume between the rigid mass 102 and the magnetostrictive bars 104. Since the vapour escapes at the top of the reservoir and since an electric field is applied on the mould (the lower part), igniting of the solvent is prevented, which is especially important when using a vacuum pump to extract the solvent.

Figure 8:
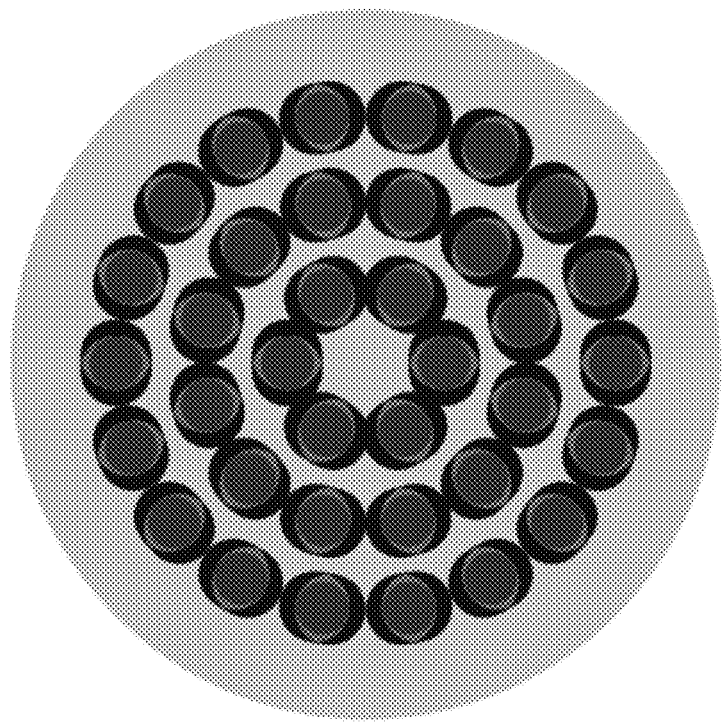
FIG. 8 illustrates a composite element comprising cylindrical magnetostrictive bars, as can be used in an embodiment of the present invention.
Figure 9:
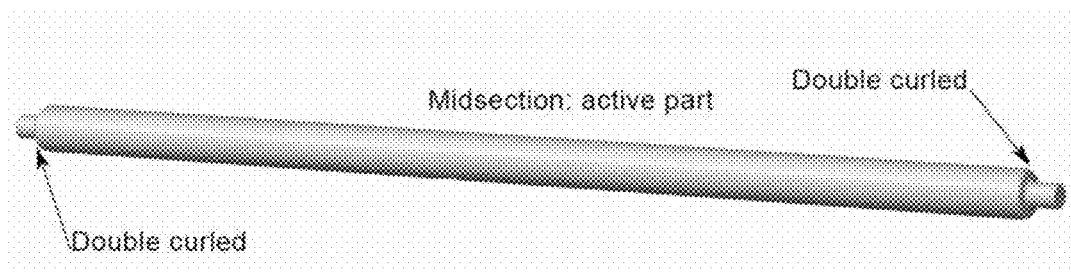
FIG. 9 illustrates a double curled cylindrical magnetostrictive bar, as can be used in a composite element as shown in FIG. 8.
Figure 10:
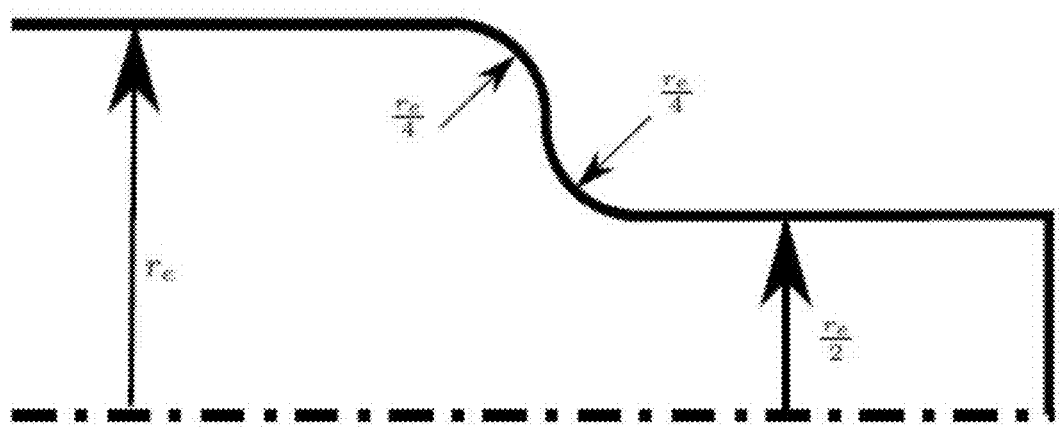
FIG. 10 illustrates the design of the transition section in the double curled cylindrical magnetostrictive bar shown in FIG. 9.

Turning now to the magnetostrictive bars 104. These will experience a change in permeability due to the stresses generated by the piezoelectric layers. One of the difficult issues is the alignment of the magnetostrictive bars 104 with respect to each other or/and with respect to the rigid mass 102. The alignment is easier to realise when the shape of the magnetostrictive bars 104 is cylindrical. An example of a composite element comprising cylindrical bars is shown in FIG. 8. The disadvantage of cylindrical magnetostrictive bars 104 is that only a topology where the magnetostrictive bars 104 interact with the rigid mass 102, is possible. On the other hand, every magnetostrictive bar can be tested separately, which is useful for test reasons. When magnetostrictive bars 104 can interact with each other as well, a more compact design can be achieved, which may be preferential for industrial applications. The ends of the magnetostrictive bars 104 have a smaller diameter than the midsection part. This allows an easy mechanical alignment with the insulation plates. To prevent that air bubbles are trapped inside the piezoelectric layer, a double curled section is used to migrate from the midsection diameter to the end diameter. An example is shown in FIG. 9 magnetostrictive effect. However, this heat treatment cannot be carried out after mechanical tooling, because that would cause unacceptable deformations and would destroy the piezoelectric polymers. The annealing process uses temperatures of 800° C. to 900° C. Electric discharge machining is chosen for shaping the magnetostrictive bars 104 with a high precision, because this avoids the introduction of internal mechanical stresses. The double curled section is a transition between two cylindrical sections, i.e., the start angle and end angle have to be parallel with the axis of rotation, as shown in FIG. 10. The transition section consists of two curves with the same radius. This shape is intended to decrease the probability of trapped air bubbles.

Figure 11:
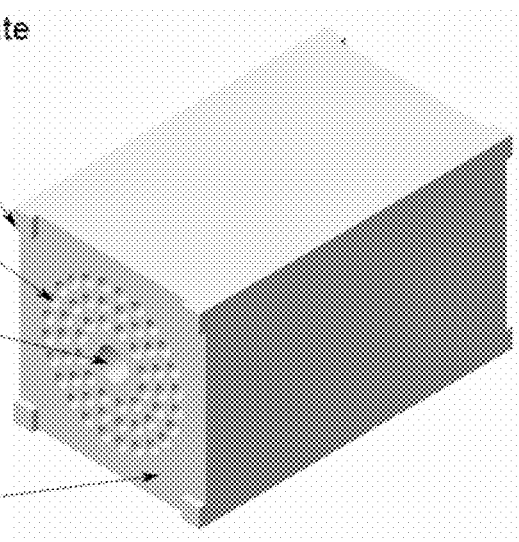
FIG. 11 illustrates a rigid mass of an exemplary prototype as can be used in embodiments of the present invention.

The rigid mass 102 is made of a paramagnetic materials which is electrically conducting and mechanically rigid. Only a limited number of materials satisfy all demands and are sufficiently cheap. One of them is INOX. But INOX is also known to be difficult to machine, which is a disadvantage. By accurately machining the holes in the rigid mass 102 and by accurately defining the diameter of the magnetostrictive bars 104, piezoelectric layers with a homogeneous thickness can be obtained. A representation of the rigid mass 102 is shown in FIG. 11.

The rigid mass 102 of the prototype example is equipped with four alignment taps which are used to align the insulation plates with the rigid mass 102. This alignment is very important since the insulation plate serves for aligning the magnetostrictive bars 104. When these alignments are not accurate, the prototype will fail. The four alignment taps are positioned in the corners in order to maximise the distances between the alignment taps and the magnetostrictive bars 104 and reduce the chance on electric discharges through the air along the surfaces of the insulation plates. It would also be possible to construct alignment taps on the insulating plates.

In that case, corresponding holes must be made in the rigid mass 102. In the prototype example, the insulation plates are constructed out of Teflon because of the excellent insulating properties.

If more rigidity is required for ensuring the alignment also other materials can be used. The hole in the centre of the rigid mass 102 serves two purposes:
1) it can be occupied by a coil in order to form a variable-inductance coil;
2) it can be occupied by the shaft of a rotor. In that case, it would be beneficial to coat the inside of this hole with a Teflon for minimising friction. Also the shaft will be made out of Teflon, mostly as an electrical insulation. A question arises concerning eddy-current losses. The magnetic flux will mainly flow in the magnetostrictive bars 104. The change of the magnetic flux will induce eddy currents, not only in the magnetostrictive bars 104, but also in the rigid mass 102. A composite rigid mass containing a fraction of non-conducting material could therefore be used to reduce the eddy-current losses, provided it has sufficient rigidity.

The electrical connectors in the present example are finger connectors. These have three functions:
1) They connect sets of magnetostrictive bars 104 to the outside electric sources;
2) They provide guidance of the magnetic flux to the permeable magnetostrictive bars 104 and by that, embed the composite in the surrounding magnetic path;
3) During the construction process, they prevent leakage of the solvent and polymer and prevent the intruding of air into the liquid state of the polymer.

Figure 12:
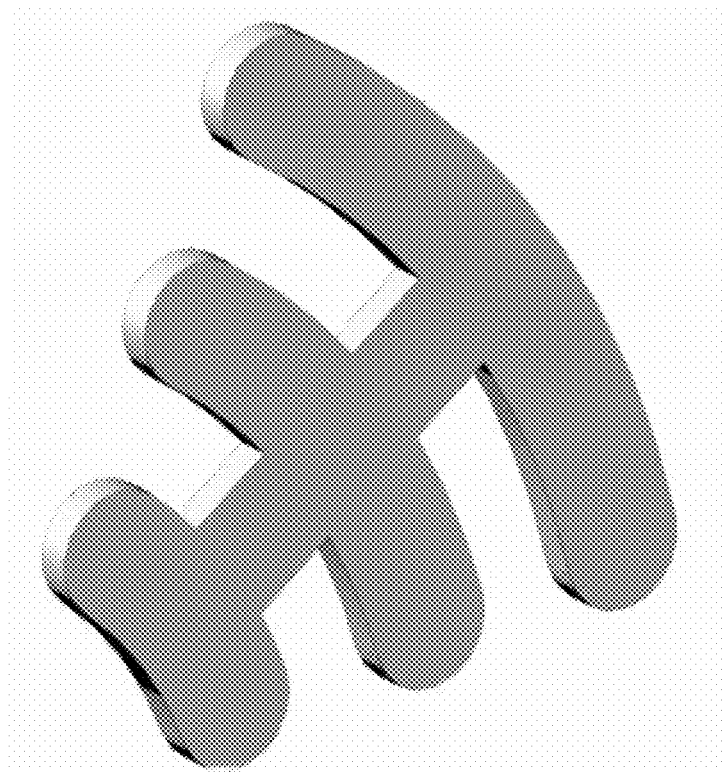
FIG. 12 illustrates finger connectors of an exemplary prototype as can be used in embodiments of the present invention.

The finger connectors are in the present example made of steel, which is ferromagnetic and conducting. The particular shape of the finger connectors explain their name. The shape can be seen in FIG. 12. The openings between the fingers are intended to reduce the eddy currents.

The insulation plates used in the present example insulate the magnetostrictive bars 104 from the rigid mass 102. The insulation plates are made from non-conducting, non-permeable material. At the moment, we think about Teflon because of its very good electrical insulation material. We hope that Teflon is sufficiently rigid to guarantee a proper fixing of the magnetostrictive bars 104 within the rigid mass 102.

Figure 13:
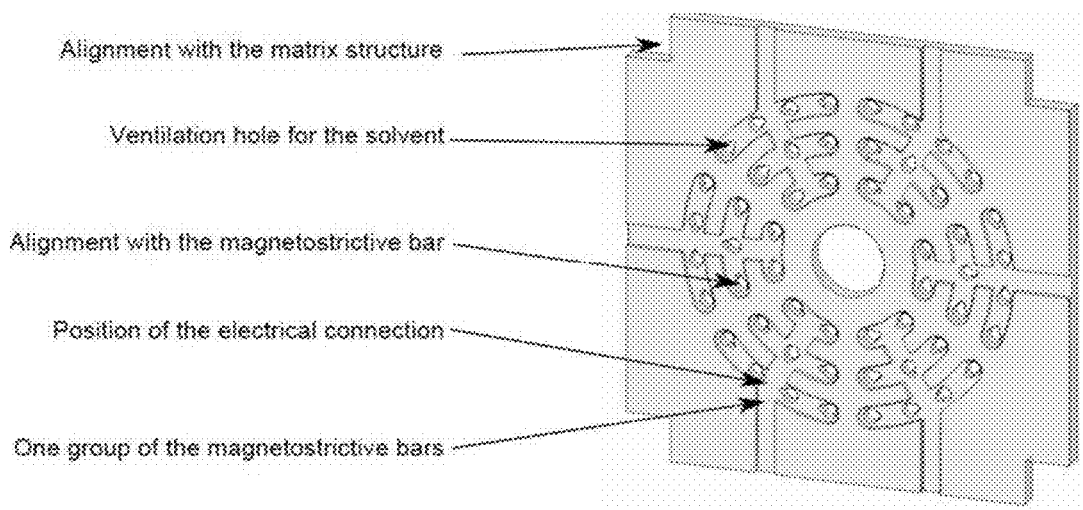
FIG. 13 illustrates an insulation plate as can be used in embodiments according to the present invention.

As shown in FIG. 13, six finger connectors fit in the insulation plate. The choice for six independently excited groups of magnetostrictive bars 104 is motivated by the intended use of the overall block as the stator of an axial-flux permanent-magnet machine. By activating four of the six groups (two adjacent groups are activated, while the next group is not activated), the rotor will align with the group that is not activated. FIG. Z6 shows the holes which align with the rigid mass 102. As already mentioned, this alignment is crucial because it determines the position of the magnetostrictive bars 104 with respect to the rigid mass 102.

In the prototype example, cover plates are used as the outer insulation plate. This plate can later also be used as an axial bearing.

In the prototype example, a reservoir is also provided which is not a real part of the active part, but is used during the manufacturing of the piezoelectric layers. As already mentioned, the piezoelectric layer is brought in place using a solvent casting technique while applying an electrical field. This electrical field has a high field strength which causes strong restrictions on the presence of air bubbles. By using solvent casting, the solvent is extracted from the solution by a vacuum pump. This leads to a decrease of the volume which explains why an additional storage capacity for this solution is needed.

By way of illustration, embodiments of the present invention not being limited thereto, processing steps for one exemplary way of machining the different components are given below. The most crucial part of the prototype is the alignment of the magnetostrictive bars 104 with the rigid mass 102. In order to obtain a correct position as easy as possible the following machining steps are suggested, comprising standard and optional steps:
a) The block of INOX is wire-cut according to the outer dimensions and to the eight alignment taps.
b) The positions and sizes of the alignment taps are measured accurately.
c) Using the dimensions of the measured alignment taps, the corresponding holes are made in the two insulation plates.
d) Using the dimensions of the measured alignment taps and measuring the thickness of the insulation plates, the cover plate can be cut accounting for the alignment taps. Here, the dimensions of the alignment taps are not that crucial, they should only fit on the electrical insulation plate.
e) The insulation plates are mounted at the correct positions (at the front and the rear) of the rigid mass 102.
f) The first cover plates are now mounted on the appropriate positions. The assembly will form the reservoir. This realizes the combined structure.
g) By clamping the combined structure in the middle, make sure that the corners are left free, the four holes in the middles of the alignment sections can be drilled.
h) In these four holes, four screws and washers are mounted to clamp the system. Due to safety reasons, the screws are preferably made of a strong and electrically non-conducting material.
i) The clamping structure in the middle of the combined structure can now be removed.
j) In the combined structure, a big centre hole with a diameter r1 can be drilled, which should ensure the alignment of these holes.

k) The cover plate can now be removed and the insulation plates, the reservoir and the rigid mass 102 can be clamped using the screws and appropriate plates.

l) In the assembly of insulation plates, rigid mass 102 and reservoir, the 54 holes with diameter re are drilled on the correct positions. This step ensures the alignment of the holes with the two insulation plates. This approach also ensures the alignment of the holes of the rigid mass 102 with the holes of the insulation plates. The holes are not drilled through the entire combined structure because a part of the reservoir should be used later on as a cover plate.

m) The insulation plates and the reservoir can be removed from the rigid mass 102 and the final machining operation can be performed.

n) The 54 holes in the rigid mass 102 are enlarged to a diameter 2 times $r_e$.

o) In the two insulation plates, the shape of finger connectors are cut. This cut should have the same depth as the thickness of the finger connectors.

p) By measuring the 12 corresponding gaps in the insulation plates, the 12 finger connectors can be constructed using electrical wire cutting. This can be done using one single sheet of steel.

r) The top layer of the reservoir can be cut away to shape the second cover plate.

s) The holes in the reservoir can be completed such that the reservoir is ready to form the piezoelectric layer.

t) The 54 magnetostrictive bars 104 are constructed by wire cutting in order to reduce the induced stresses since these stresses would adversely influence the magnetostrictive properties of the material. Before processing, the magnetostrictive material must be annealed to reduce all stresses.

Figure 14:
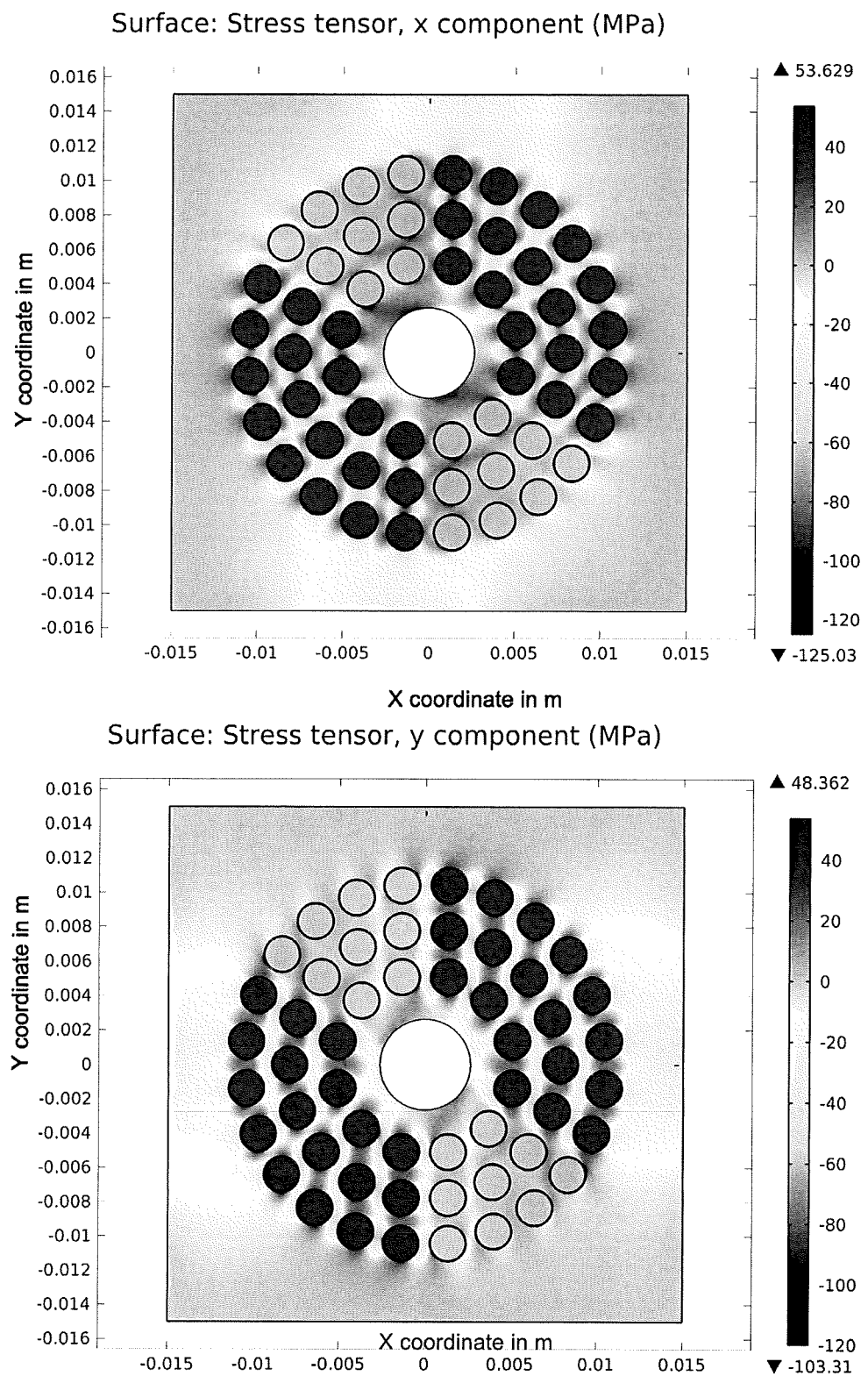
FIG. 14 illustrates the working principle of a system according to an embodiment of the present invention.

The expected obtained final result of the working prototype will be operated as shown in FIG. 14. When activating four of the six groups, than a differential measurement, between an activated magnetostrictive bar and a non-activated magnetostrictive bar, can give a value for the change of the reluctance of the magnetic path.

In this prototype, the device was constructed with an active part. The active part consists of a hollow cylindrical core, which is paramagnetic. In the cylindrical core, there is place for one single magnetostrictive bar. Around the cylindrical core, a coil fits inside the active part. This approach allows to change the inductance of the coil by changing the reluctance inner and outer part. It is suggested to construct this coil with an active core first since it can be used to test the method of applying forces on the magnetostrictive electrode and the electric mass by the piezoelectric layer.

It will be clear that embodiments are not restricted hereto.

For the rotor, a simple design has been chosen. This rotor consists of three parts:
(i) a non-conducting and non-permeable support which fixes the permanent magnets
(ii) the permanent magnets themselves and
(iii) a permeable yoke at the back sides of the permanent magnets.

Figure 15:
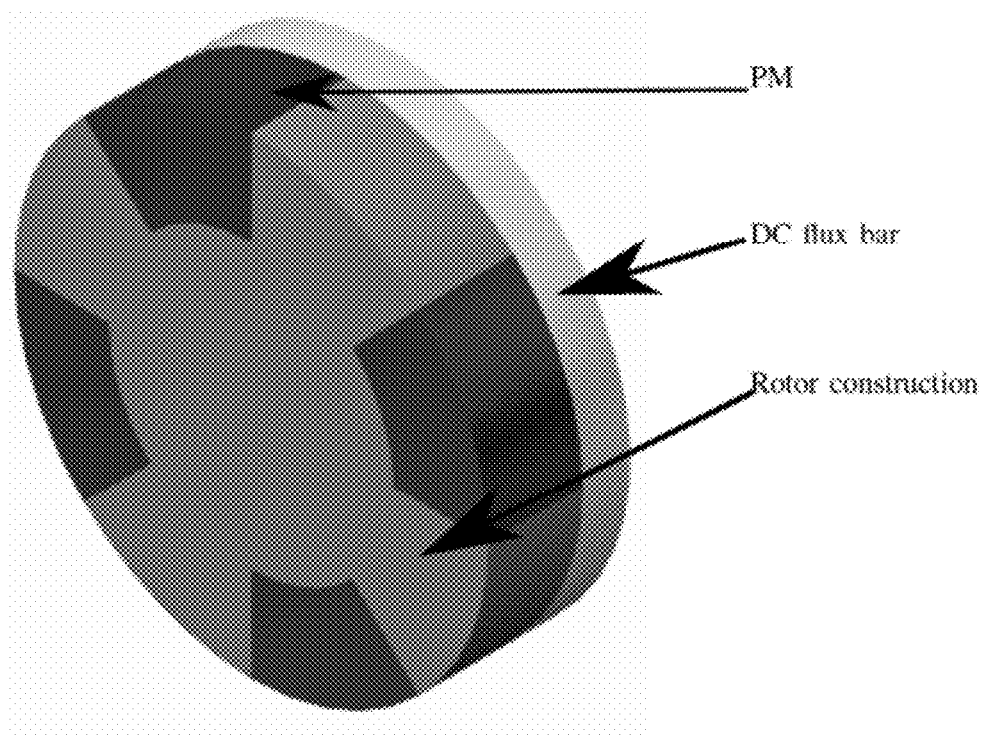
FIG. 15 illustrates a rotor as can be used in embodiments of the present invention.

A schematic representation of the rotor is shown in FIG. 15.

To test the different magnetostrictive bars 104 individually, every magnetostrictive bar has to be surrounded by the rigid rigid mass. This requirement is set in view of test purposes but is not strictly required in industrial applications. It must be easy to transform the obtained design into a variable coil and a permanent magnet variable reluctance machine.

Alternative designs were also considered for the prototype.

Figure 16:
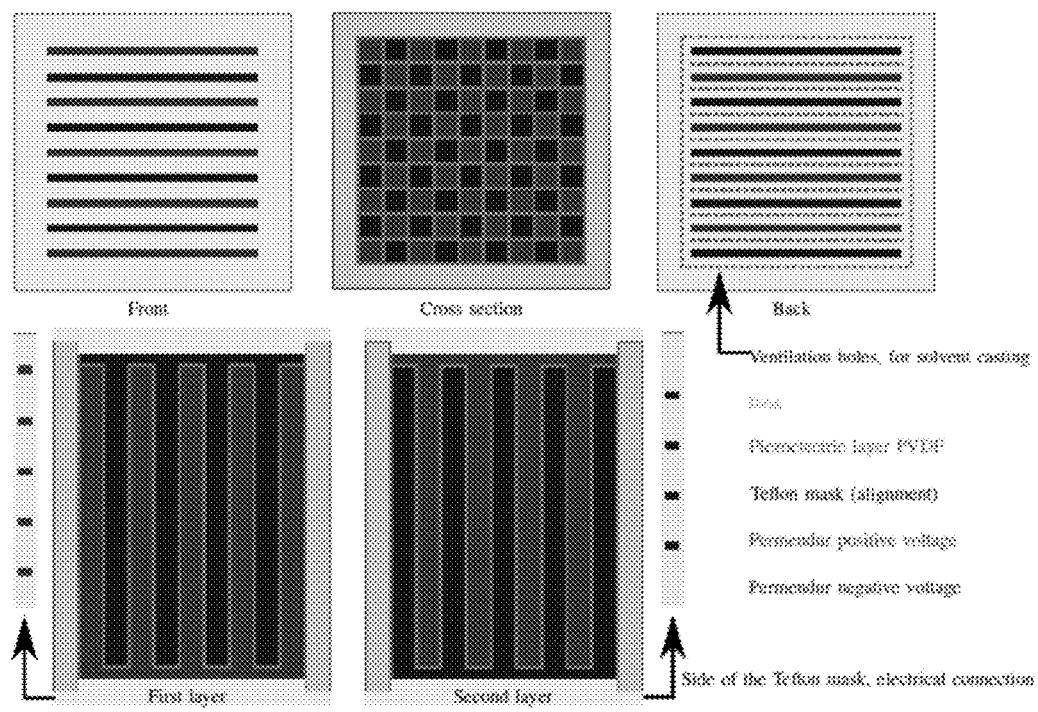
FIG. 16 illustrates an alternative composite element as can be used in embodiments of the present invention.
Figure 17:
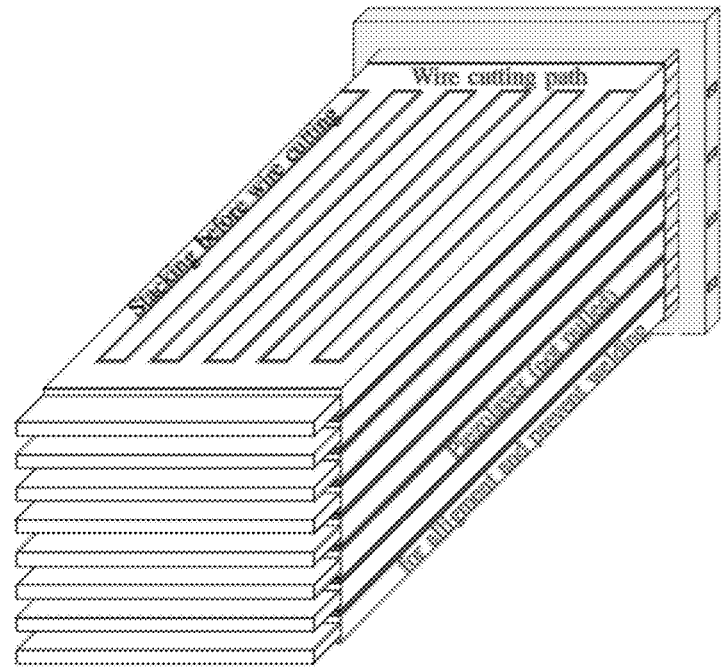
FIG. 17 illustrates a schematic representation of how a wire cutting can be performed for an alternative composite element as shown in FIG. 16.
Figure 18:
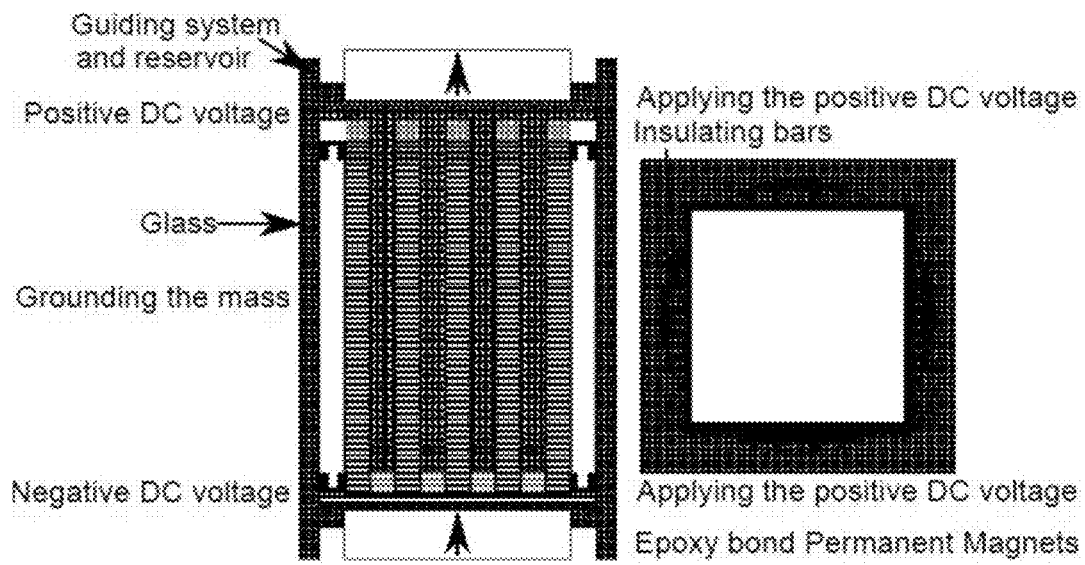
FIGS. 18 and 19 illustrate a design of the composite element and the stator when making use of the alternative composite element as described in FIG. 15.

Alternative designs can be for example layered or checker board composite pieces. The advantage is that the magnetostrictive parts are more concentrated. This would lead to a higher energy density. The composite, shown in FIG. 16, is built out of sheets. Every layer exists of a sheet cut in two parts. On the first half, the positive voltage is applied and on the other half, the negative voltage is applied. The cut is not straight, i.e., it has a finger shaped pattern. The rigid mass composite appears when considering the cross section. The upper and lower layers have exactly the same cut pattern, but now the voltages are reversed. A cutting pattern as can be used in embodiments of the present invention is shown in FIG. 17. To keep everything aligned, a Teflon mask is needed. The front Teflon mask works as a cap that fits on the INOX electric mass. In this mask, slots are made which have a thickness of 50% of the thickness of the plates. This means that the front side and the end side of the plates have to be processed in order to fit the mask. The processing of the plates requires a removal of one fourth of the plate at the down side and one fourth of the plate at the upper side. The other mask has the same geometry, but with some additional ventilation holes for extracting the solvent from the piezoelectric polymer. On the first side of the mask, the positive voltage can be applied. At the other side, the negative voltage can be applied. To ensure that all layers are identical, the layers must be placed upon each other, clamped and wire cut in one single treatment. To prevent that the layers are welded to each other, the piezoelectric polymer can be placed between two layers. When this strategy is used, a strongly dissolved solution of the extra needed piezoelectric polymer, is poured to fill the gaps. The filling up should be done as shown in FIG. 18.

On each mask, an insulation bar frame is placed and fixed by permanent magnets. The first side is placed in the electrical mass, which behaves as a bucket that can hold the dissolved polymer. Before adding the dissolved polymer, a guiding square is placed around the electric mass. The guiding system contains the holes allowing to connect the required voltage potentials on the correct places. Now, the dissolved polymer is added in the bucket. The second part is slid in place while the air escapes slowly out of the ventilation holes. The dissolved polymer will fill all holes due to the extra pressure. The solvent diffuses to the ventilation holes. Possibly, additional weight is needed to ensure that all air is pushed out rapidly while the positions of all parts remain unchanged. This process must be sufficiently slow in order to avoid that air bubbles are trapped in the liquid.

Figure 19:
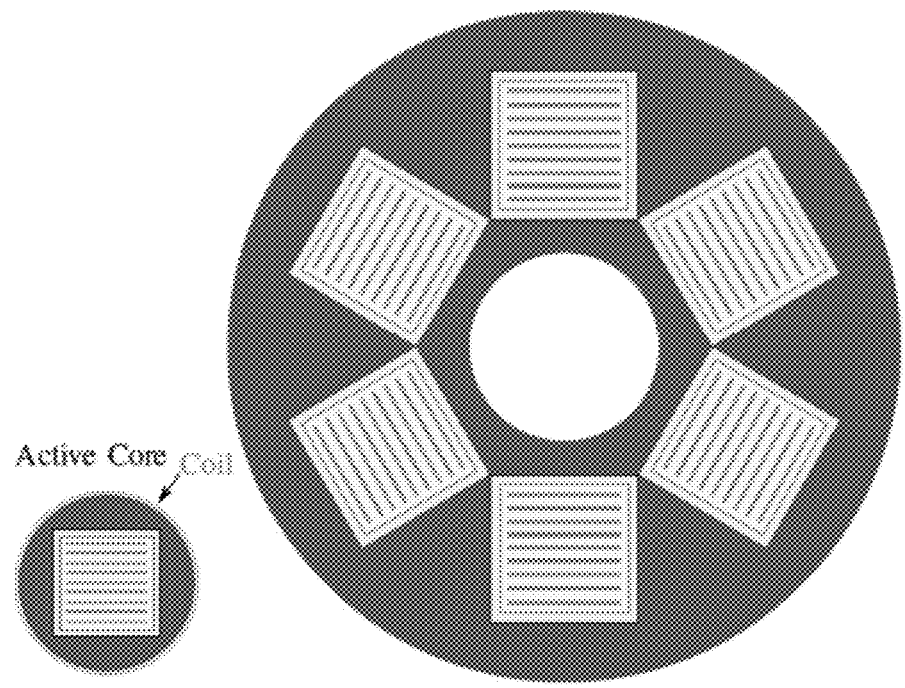

By way of illustration, embodiments of the present invention not being limited thereto, an example of a rotor, active core with plates and a coil, and a stator having plate based active elements is illustrated in FIG. 19.

Figure 20:
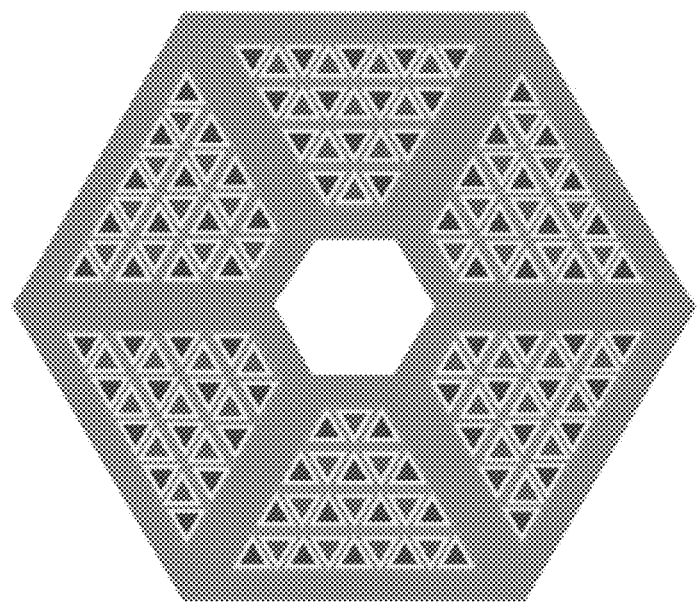
FIG. 20 illustrates a stator comprising sections with magnetostrictive bars having a triangular shaped cross-section, according to an embodiment of the present invention.
Figure 27:
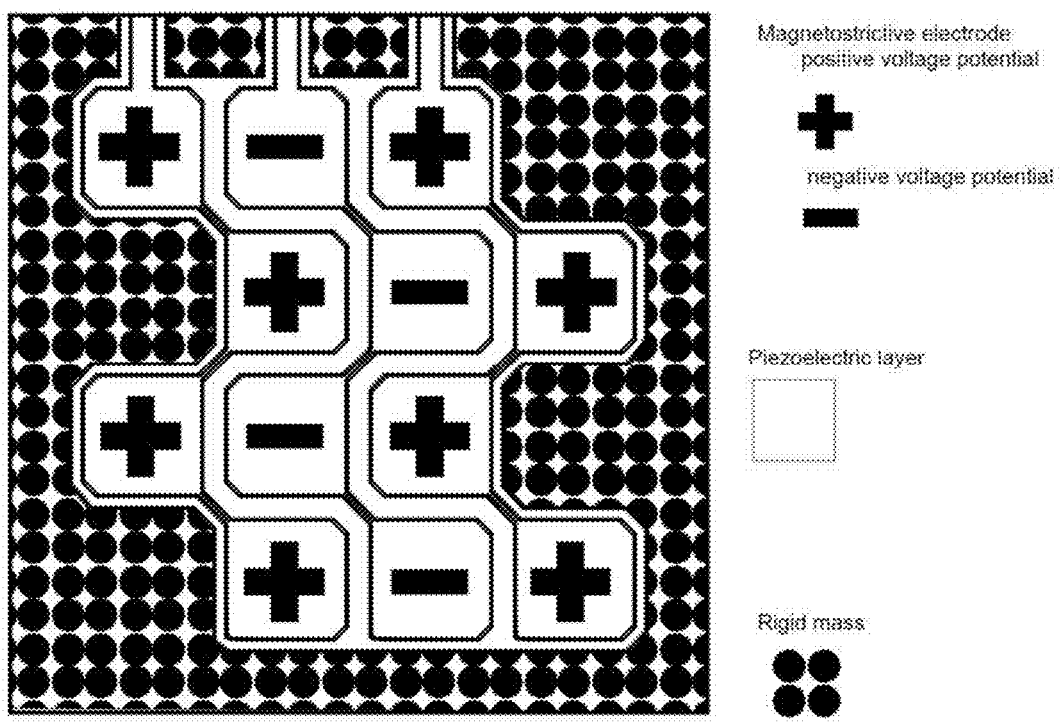
FIG. 27 and FIG. 28 illustrate additional topologies for the composite element as can be used in embodiments according to the present invention.
Figure 28:
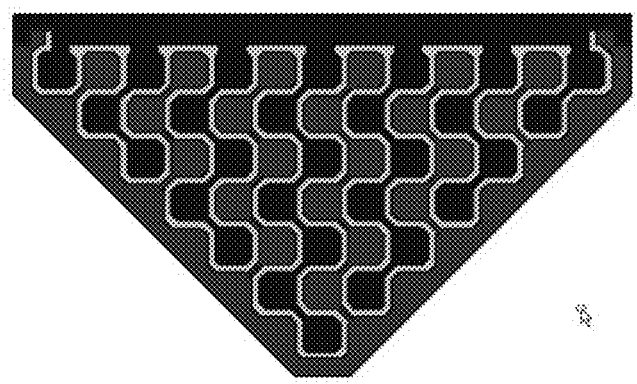

Yet another alternative makes use of magnetostrictive bars 104 having a triangular cross-section. An example thereof is shown in FIG. 20, illustrating a stator with 6 sections of triangular shaped magnetostrictive bars 104. Further alternatives are shown in FIG. 27 and FIG. 28, illustrating situations wherein the magnetostrictive bars 104 are interconnected, resulting in a more easy electrical connection to the magnetostrictive bars.

Further by way of illustration, embodiments of the present invention not being limited thereto, a simulation of an electrical motor according to an embodiment of the present invention is discussed. The simulation is made for an axial flux machine containing six stator bars. The stator bars are magnetostrictive electrodes surrounded by piezoelectric layers, according to an embodiment of the first aspect of the present invention. The rigid mass 102 forms the outer layer of the stator. Combined with the six stator bars it provides a sufficient rigidity. In order to obtain an as high as possible magnetic flux density, two radially magnetised neodymium permanent magnets are inserted in each rotor. The two magnets with matching polarities are connected to a rotor pole. This ensures that the magnetic rotor poles can deliver a higher magnetic flux density for the considered rotor pole angle.

This increase of the magnetic flux density for the same depth of the rotor, leads to a higher power density of the design. A higher magnetic flux density also leads to a higher reluctance torque, as long as the ferromagnetic material is not saturated.

The dimensions of the axial flux machine simulated are given in Table 1. The used materials, including their material properties, are collected in Table 2.

TABLE 1

| Stator | | | |
|---|---|---|---|
| stator length | $l_{stator}$ | 21.4 | mm |
| sides of the magnetostrictive electrode | z | 1 | mm |
| number of electrodes in the first layer | $n_{elec1}$ | 3 | |
| number of electrode layers | $n_{elec2}$ | 5 | |
| thickness of the piezoelectric layer | $d_{piezo}$ | 15 | µm |
| minimum thickness of the rigid mass | $d_{rigid}$ | 1 | mm |
| Rotor | | | |
| rotor length | $l_{rotor}$ | 3.25 | mm |
| angle rotor pole | $\theta_{pole}$ | pi/3 | rad |

Although each rotor consists of two rotor poles, the behaviour of this machine is the same as a single pole pair machine. Indeed, the two rotor poles operate identically, i.e., they do not compensate each other when the reluctance torque decreases as would be expected for a two pole switched reluctance machine. Based on the literature, it is clear this is not the best configuration, although it is the simplest one. This allows to validate the principle and to compare the principle with an existing application. Its simplicity allows a simple state machine based control of the machine. It will be clear that a more complex configuration can result in even better results.

Figure 21:
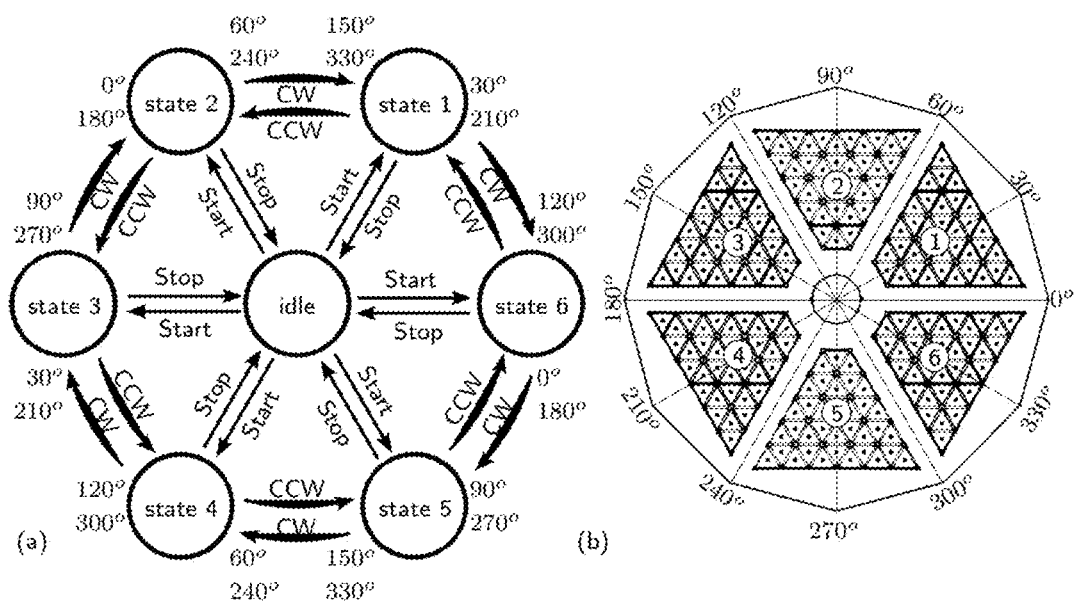
FIG. 21 illustrates another design of a stator, according to an embodiment of the present invention, with a possible state machine as control strategy.

The seven possible states are shown in Table 3, while the state machine itself is shown in FIG. 21. The axial flux machine always starts and stops in the idle state. In this state, no stator bars are activated, i.e. no voltage is applied. Also in case of a black out, the controller must return to the idle state, implying it must be a save state. In case of a black out, the rotor rotates until it reaches the nearest state, i.e., the alignment with a stator bar or the alignment with two stator bars.

TABLE 2

| Magnetostrictive electrodes: Permendur | | | |
|---|---|---|---|
| Anisotropic constant | $K_1$ | 2000 | J/m³ |
| Anisotropic constant | $K_{12}$ | 0 | J/m³ |
| Saturated magnetostriction in the 100 direction | $\lambda_{100}$ | 101 | µm/m |
| Saturated magnetostriction in the 111 direction | $\lambda_{111}$ | 27 | µm/m |
| Saturated magnetization | $M_s$ | 1.91 | MA/m |
| Hysteresis parameter | $\beta$ | 0 or 0.3 | |
| Stiffness matrix coefficient | $C_{11}$ | 296 | GPa |
| Stiffness matrix coefficient | $C_{12}$ | 153 | GPa |
| Stiffness matrix coefficient | $C_{44}$ | 192 | GPa |

TABLE 2-continued

| Rigid mass: Inox DIN 1.4301 | | | |
|---|---|---|---|
| Young's modulus | Y | 200 | GPa |
| Poisson's ratio | $\nu_{me}$ | 0.29 | |
| Relative permeability | $\mu_{ma}$ | 1 | |
| Piezoelectric layer: P(VDF-TrFE-CFE) 62/38/4 | | | |
| Young's modulus | Y | 1.2 | GPa |
| Poisson's ratio | $\nu_{me}$ | 0.22 | |
| Relative permeability | $\mu_{ma}$ | 1 | |
| Piezoelectric coefficient | $d_{33}$ | 0.346 | nC/N |
| Piezoelectric coefficient | $d_{15}$ | 0 | nC/N |
| Relative permittivity | $g_{el}$ | 50 | |
| Permanent magnet: Neodymium | | | |
| Relative permeability | $\mu_{ma}$ | 1 | |
| Remanent magnetic flux density | $B_r$ | 1.3 | T |
| Rotor pole: Iron | | | |
| Relative permeability | $\mu_{ma}$ | 1000 | |

TABLE 3

| | Stator bars | | | | | |
|---|---|---|---|---|---|---|
| State | 1 | 2 | 3 | 4 | 5 | 6 |
| Idle | 0 | 0 | 0 | 0 | 0 | 0 |
| 1 | 1 | 0 | 1 | 1 | 0 | 1 |
| 2 | 1 | 0 | 0 | 1 | 0 | 0 |
| 3 | 1 | 1 | 0 | 1 | 1 | 0 |
| 4 | 0 | 1 | 0 | 0 | 1 | 0 |
| 5 | 0 | 1 | 1 | 0 | 1 | 1 |
| 6 | 0 | 0 | 1 | 0 | 0 | 1 |

When starting the machine, six possible states can be activated, i.e., state 1 to 6. This state depends on the current position of the rotor pole and on the fact whether the rotor has to rotate clockwise (CW) or counter clockwise (CCW).

For CW operation, the first state in CCW direction from the rotor pole will be used. For CCW operation, the first state in CW direction from the rotor pole will be used. A next state is activated when the rotor pole passes the angle corresponding with the next state. Notice that the axial flux machine has two pole pairs. One electric cycle corresponds with a mechanical rotation of 180°, which implies each state corresponds with four activation angles. As an example, state 2 is activated when the rotor angle is 60° or 240° when rotating CCW, or 0° or 180° when rotating CW.

This state machine is implemented in the magneto-mechanical solver, since activating a new state comes together with a new voltage excitation pattern for the piezoelectric layer and thus requires an electrostatic simulation. When a magnetic bar is activated, the positively magnetostrictive electrodes get a voltage potential of 975V and the negatively magnetostrictive electrodes get a voltage potential of −975V to obtain the required electric field strength of 130 MV/m. Activating or deactivating a stator bar leads to a new structural mechanical situation which changes the magnetic properties of the magnetostrictive electrodes. The required voltage can be kept low by decreasing the sides z of the magnetostrictive electrodes, which allows to reduce the thickness of the piezoelectric layer. This leads to a higher number of smaller magnetostrictive electrodes.

A new electrostatic simulation is only carried out when a new state is applied. Mechanical simulations, however, have to be carried out for every rotor position. Indeed, the magnetic flux density will change. The magnitude of the magnetic flux density is too high to neglect a change of the magnetostrictive effect. In this simulation, it is assumed that the magnetostriction implies a small displacement. Otherwise, the electrostatic simulation should be repeated for every magnetic flux density while incorporating the displacements of the magnetostrictive electrode edges.

The magnetic radially symmetric finite element (FE) solver is used to simulate the magnetic flux distribution in function of the rotor position and the activation pattern of the stator bars. Due to the symmetry, only 180° of the machine is modelled. In the simulation a number of assumptions are made.

The first assumption is that the flux in a stator bar has mainly an axial component. This is important because in such a situation the magnetic field strength at the reference radius is representative for determining the entire magnetic behaviour. Indeed, when the flux has a purely axial direction, then the magnetic flux density is homogeneous along the radial direction. The magnetostrictive electrodes are aligned with the axial direction. A magnetic flux along the -direction experiences a succession of permeable bars, non-permeable piezoelectric layers and rigid mass pieces, implying a high reluctance and thus a small flux.

The second assumption is that the materials are used in their linear range, i.e., it is assumed that the permeability for a given stress situation is constant. Although the energy based material model is able to calculate the non-linear behaviour, the magnetically stored energy in the material is not directly known when the magnetic field and the mechanical stresses change. One possibility is to calculate some BH curves for different stresses and magnetic fields and use these curves to obtain the stored magnetic energy. Unfortunately, this excludes the hysteresis effect which is incorporated in the energy based material model. To verify the second assumption, the average torque can be calculated. Instead of using the energy to calculate the reluctance torque, it is also possible to implement the Maxwell stress tensor.

Figure 22:
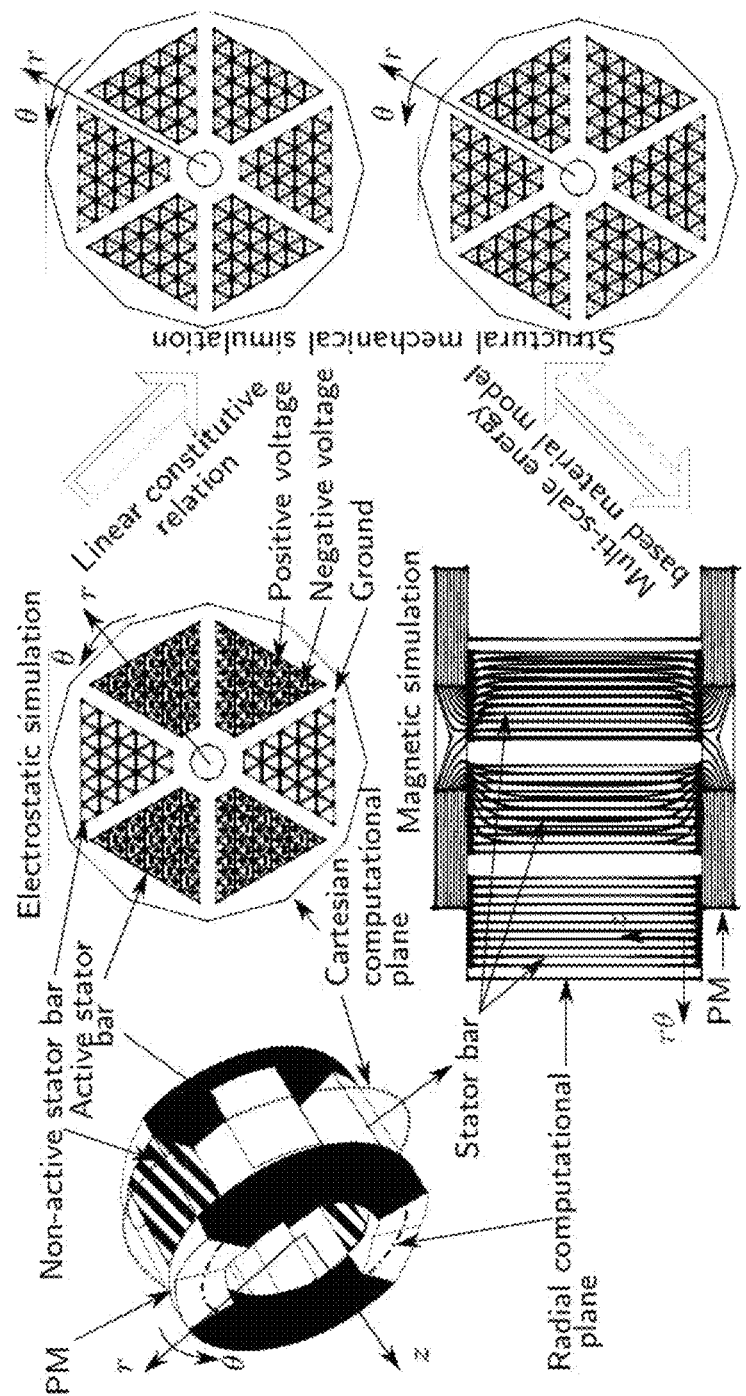
FIG. 22 illustrates a schematic representation of a simulation model used, according to an embodiment of the present invention.

Simulation results as follows are obtained. An overview of the simulation principles is given in FIG. 22.

The motor is simulated for a rotor period of 120°, i.e., starting with the alignment with stator bar 1 and ending with the alignment of stator bar 3. This implies that the simulation starts in state 1 and then goes counter clock wise to state 4. This requires four electrostatic simulations, since an angle of 30° appears between two consecutive states. The magnetically radially symmetric solver uses a step of 5° which means seven iteration processes are needed between two different states. Although 60° is enough to obtain the torque cycle, 120° is required to obtain the evolution of the magnetisation of a stator bar.

Figure 23:
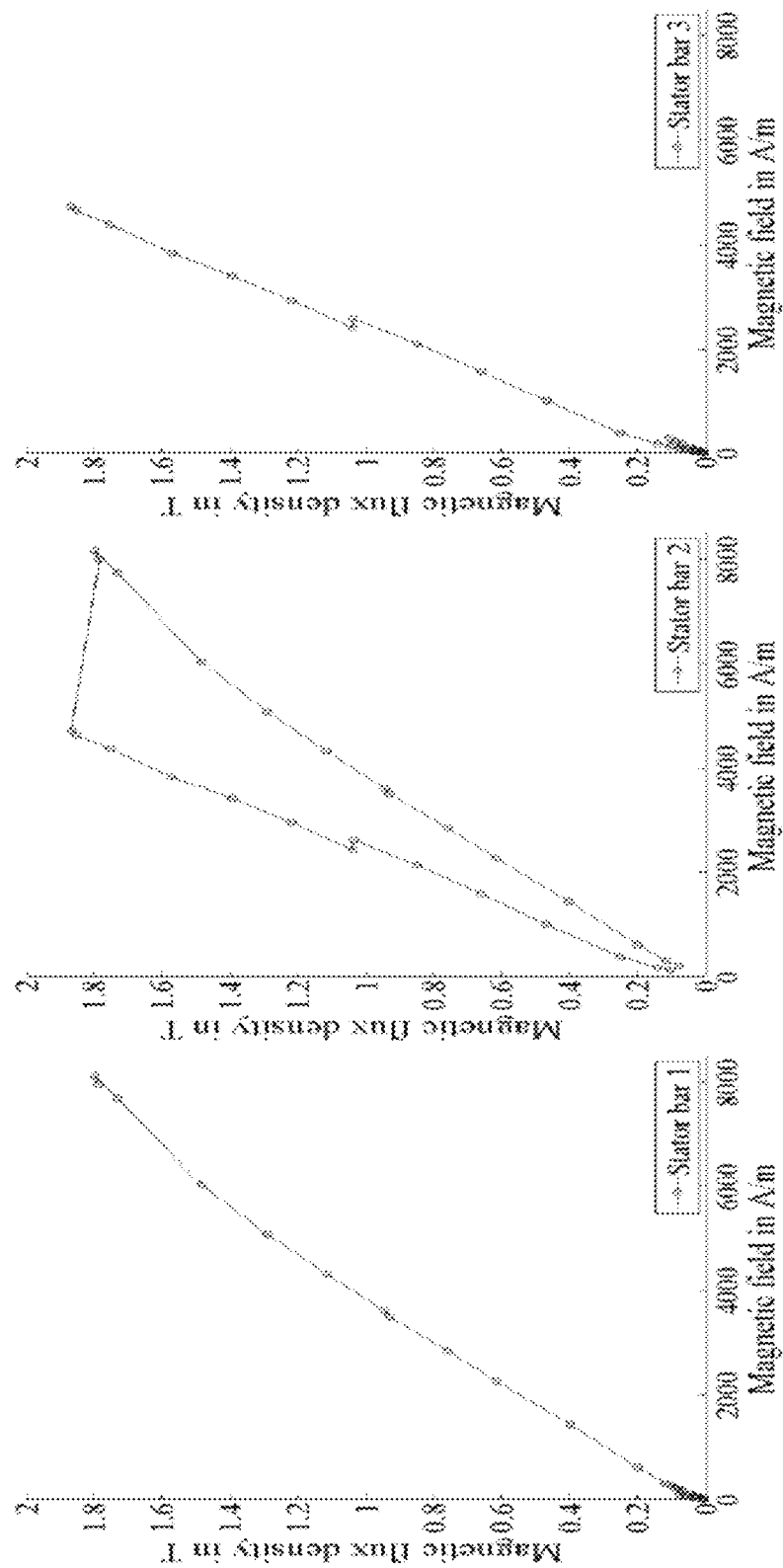
FIG. 23 and FIG. 24 illustrates shows the different operating points of the different stator bars, when the hysteresis effect is not taken into consideration (FIG. 23) and where the hysteresis effect is taken into consideration (FIG. 24), according to embodiments of the present invention.
Figure 24:
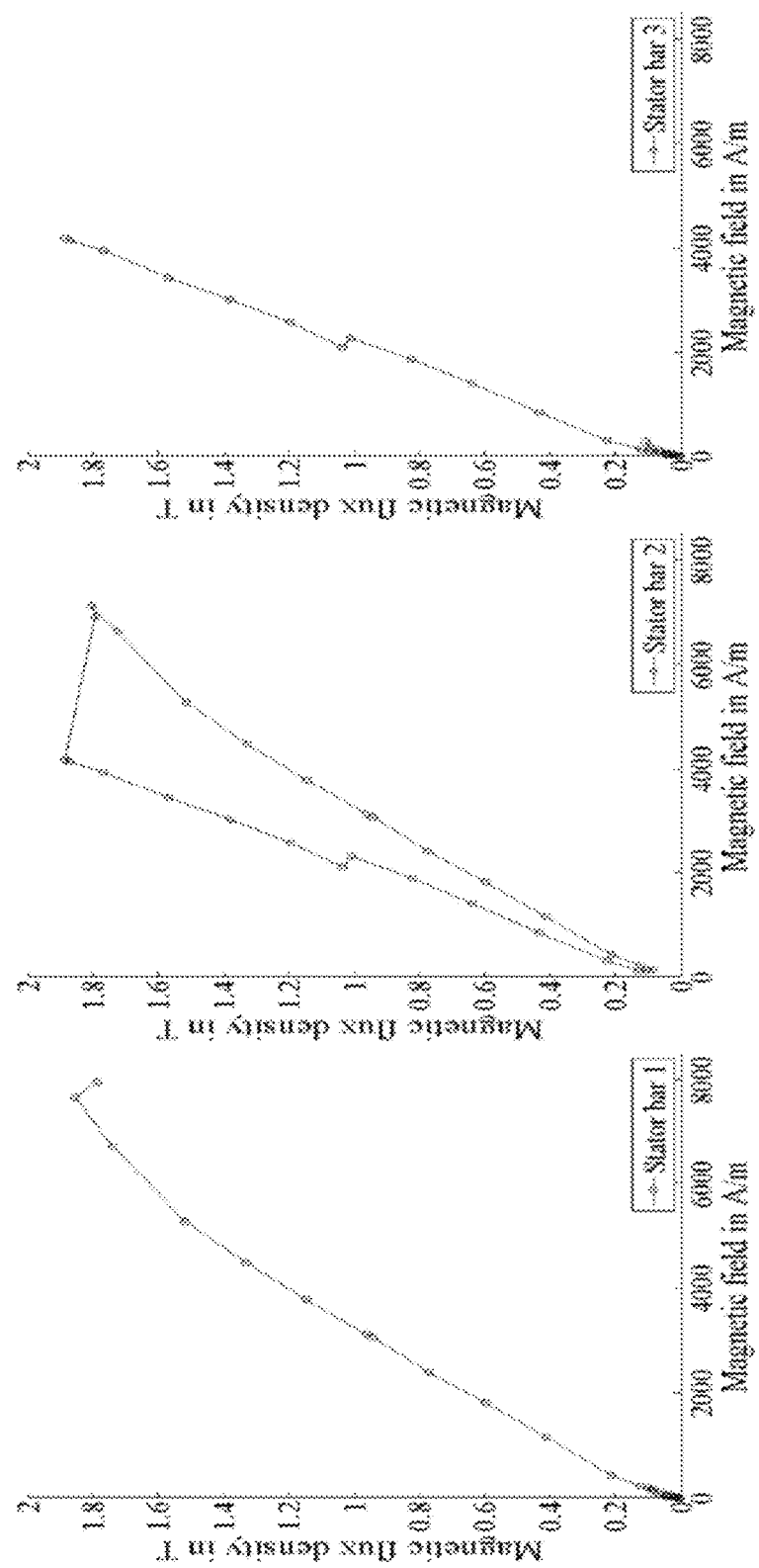

FIG. 23 shows the different operating points of the different stator bars, when the hysteresis effect is not taken into consideration. FIG. 24 shows the same, when the hysteresis effect is taken into consideration, showing the effect of hysteresis on the concept. First the anhysteresis curve of FIG. 23 will be discussed.

Since the motor is simulated for a rotor period of 120°, starting from state 1 and ending at state 4, the operating points of a stator bar form a closed loop. This closed loop goes clockwise, i.e. mechanical work is delivered.

The simulation starts with the rotor aligned with stator bar 1, while the biaxial stress is activated in stator bar 1 and stator bar 3. The highest magnetic flux density goes through stator bar 1. To reduce the stored magnetic energy, the flux density has to reduce in stator bar 1. Because the biaxial stress is activated in stator bar 1 and stator bar 3, stator bar 2 has the highest permeability. This implies that the decrease in the magnetically stored energy will be maximized when the rotor rotates to stator bar 2 and not when it rotates to stator bar 3.

As shown in FIG. 23, the magnetic flux density and the magnetic field strength first increase when the rotor starts to rotate. This increase occurs because the rotor leaves a metastable equilibrium. This also implies there is no starting torque, but this disadvantage can be avoided with a better motor design.

When the rotor is aligned with stator bar 2, the difference in stored energy between the alignment with stator bar 1 and stator bar 2 is converted into mechanical energy. Although we mainly focus on magnetic energy, notice that also elastic energy is converted into mechanical energy. Indeed, the change in magnetisation in combination with the biaxial stress has an influence on the magnetostriction. The elastic energy due to the biaxial tension and the magnetostriction change in function of the rotor position. This implies the elastic energy also has an effect on the generated torque. When the rotor is aligned with stator bar 2, the biaxial tension is activated in stator bar 2. This decreases the permeability, which is the conversion of electrostatic energy into magnetic and elastic energy. At this point, the biaxial tension is activated in stator bar 1 and stator bar 2. The biaxial tension was deactivated 30° degrees earlier. The biaxial tension in stator bar 3 is deactivated when the magnetic flux density is low. This implies that almost all the magnetically stored energy is converted into mechanical energy. Important here is the behaviour of the magnetisation. When considering FIG. 24, the remanence of stator bar 3 is small, due to the biaxial tension. Because the biaxial tension is deactivated before the magnetic field becomes zero, the coercivity decreases rapidly. This helps to reduce the magnetic hysteresis losses and to force the magnetization to zero. This realizes a reset on the hysteresis effect.

Deactivating the biaxial stress in stator bar 3 has also an influence on the behaviour of stator bar 1 and 2. Indeed, only one electric mass is used, mechanically connecting the different stator bars. This mechanical connection transfers some mechanical stress to the other stator bars, under the form of a tension or a pressure. This explains the discontinuities in the BH-curves (FIG. 23 and FIG. 24) The influence of the hysteresis in minimal, as shown in FIG. 24. The difference between the enclosed areas of FIG. 24 and FIG. 23 is an indication for the hysteresis losses. This difference is 22.5%.

From the activation of the biaxial tension in stator bar 2, the cycle of 60° is completed and repeated. The magnetic behaviour of stator bar 2 equals the behaviour of stator bar 1 in the previous cycle until the rotor is aligned with stator bar 3. The rotor position evolves from an alignment of stator bar 2 with biaxial tension to an alignment of stator bar 3 without biaxial tension. Halfway, the biaxial tension in stator bar 1 is deactivated. When the rotor aligns with 30°, the biaxial stress in stator bar 1 is turned off. This causes a large discontinuous step in the elastic energy. This discontinuity has no effect on the further decrease in the elastic energy and the magnetic energy due to the rotation of the rotor. Indeed, in this position the rotor is magnetically connected with stator bar 2 and stator bar 3, which means almost no flux is going through stator bar 1. This implies almost no magnetic energy nor elastic energy due to the magnetostriction is stored in stator bar 1. This allows to determine the total torque in function of the rotor angle by the method of virtual work.

This design does not provide a starting torque. This disadvantage is due to the motor design, i.e. the single pole pair machine, and not due to the motor principle. When a proper two pole pair machine would have been be designed, a starting torque would be available. A first pole would be located between two stator bars, while the second pole would be aligned with a stator bar. Such a design would realise a starting torque, but would require a controller with a larger number of states.

The simulation results do not only prove that the proposed motor principle works, but also show that the obtained torque has the same order of magnitude as for a commercially available motor with stator coils.

Indeed, when calculating the average torque, one obtains an average torque of 2.6 mNm, reduced to 2.3 mNm due to hysteresis, for a motor having dimensions similar to existing Brushless DC-servomotors. More particularly, these torques are only 8% and 11.5% percent higher than 2.3 mNm. The efficiency of the present concept nevertheless is significantly higher due to the high stator losses in existing Brushless DC-servomotors.

The losses for the simulated prototype consist of the dielectric losses (piezoelectric material), the hysteresis losses (magnetostrictive material), the eddy current losses, the friction losses and the supplementary losses. The friction losses and the supplementary losses are negligible when the power output is below 1 kW. Consequently, there is focussed on the dielectric losses and the hysteresis losses. This means that the assumption of neglecting the eddy currents is made. The composite material consists of 1D magnetostrictive electrodes, further reducing the eddy currents.

In steady state, the electrical energy together with the electrostatic energy (fed back to the driver at an earlier instant of time) is converted in the piezoelectric material 106. This conversion leads to electrostatic energy, elastic energy and some losses. The elastic energy is converted into magnetic energy with some losses. Both losses account for the dielectric losses. The magnetic energy is converted into mechanical energy and the hysteresis losses. The input energy, which is not converted to useful mechanical energy, will be stored as electrostatic energy.

This electrostatic energy can be fed back to the driver and used for the next stator bar. This reduces the required electrical energy in steady state. This energy must be delivered to the driver in the start up procedure. The dielectric losses of the piezoelectric material 106 allow an efficiency of 86.4% per cycle. The hysteresis losses amount to 22.5% leading to a global efficiency of 67%.

This efficiency is the same for continuous or for position step operation. Indeed, there is no need for a continuous current to keep the rotor at a certain position as for a switched reluctance machine or of some types of stepper motors. When comparing these results with piezoelectric stepper motors, like the Traveling-Wave Ultasonic Motor which has an efficiency less than 30% [79], it becomes clear these piezoelectric stepper motors require a sophisticated driver.

This approach assumes that the driver is able to convert the remaining energy, the stored energy in the form of electrostatic, elastic and magnetic energy which is not converted into mechanical energy or in heat due to the dielectric losses and the hysteresis losses back into electric energy. This extraction should occur when the voltage decreases at the electrodes after the stator has converted part of the stored energy into mechanical energy.

Notice that the performance of this machine is similar with the performance of an electromagnetic machine with stator coils. This includes an important advantage compared with electrostatic motors. Electrostatic motors are used in MEMS application, because even very small diameters can be fabricated. Unfortunately, their torque and mechanical power output are low compared with an electromagnetic machine, leading to a low energy density. In the MEMS applications, electromagnetic machines with stator coils are difficult to fabricate, especially the coil-like structures. The proposed design is an answer to this difficulty.

From the results discussed above, it can be seen that, although a simple design was simulated, the results show that an average torque is obtained that is approximately the same as the one of a conventional electrical motor, i.e. only a difference of 11.5% is obtained. Notice also the stalling torque. It is to be noticed that by incrasing the number of pole pairs, the torque density and power density still can be increased and a sufficient starting torque can be generated.

The invention claimed is:

1. A stator or a rotor for use in an electrical machine, the stator or rotor comprising a composite element,
    the composite element comprising
        a rigid mass suitable for comprising at least one magnetostrictive electrode bar,
        at least one magnetostrictive electrode bar,
        piezoelectric material in between said rigid mass material and said magnetostrictive electrode bars,
    wherein the rigid mass, the at least one magnetostrictive electrode bar and the piezoelectric material are arranged such that applying a voltage between the rigid mass and one or more magnetostrictive electrodes, causes piezoelectric effects in the piezoelectric material inducing stress in the bi-axial plane of the at least one magnetostrictive bar and a change of the permeability of the at least one magnetostrictive bar in a direction perpendicular to the bi-axial stress plane.

2. A stator or rotor according to claim 1, wherein the piezoelectric material is applied as piezoelectic layers surrounding the at least one magnetostrictive material.

3. A stator or rotor according to claim 1, wherein the piezoelectric materials are mechanically and electrically connected with the magnetostrictive material and the rigid mass or wherein the piezoelectric materials are any of ceramics or electro-active polymers.

4. A stator or rotor according to claim 1, wherein the rigid mass is a single piece rigid mass wherein at least one magnetostrictive element is used.

5. A stator or rotor according to claim 1, wherein the at least one magnetostrictive bar is a plurality of magnetostrictive bars arranged in an array or wherein the at least one magnetostrictive electronde comprises a plurality of magnetostrictive electrodes whereby some or all of the magnetostrictive electrodes are electrically interconnected or, wherein the at least one magnetostrictive bar is a cylindrical bar or wherein the at least one magnetostrictive bar is an elongated bar having a triangular shaped cross-section or wherein the at least one magnetostrictive bar is an elongated bar having a rectangular shaped cross-section or wherein the at least one magnetostrictive bar is an elongated bar having a hexagonal shaped cross-section.

6. A stator or rotor claim 1, wherein the composite material is designed such that the distance between the rigid mass and adjacent magnetostrictive bars is equal to or smaller than half the distance between two adjacent magnetostrictive bars.

7. A stator or rotor according to claim 1, wherein rigid mass and/or the piezoelectric materials are non-magnetic or wherein the rigid mass comprises a material that is electrically conducting and mechanically rigid.

8. A stator or rotor according to claim 1, wherein the stator or rotor furthermore comprises electrical connectors for alternatingly connecting different magnetostrictive bars to outside electrical sources.

9. A stator or rotor according to claim 1, wherein some of the electrical connectors are grouped such that, in use, the magnetostrictive electrodes under positive voltage and under negative voltage form a checkerboard pattern.

10. A stator or rotor according to claim 1, wherein the stator or rotor furthermore comprises insulation plates for insulating the magnetostrictive material from the rigid mass.

11. An electrical machine comprising a stator or rotor according to claim 1.

12. An electrical machine according to claim 11, wherein the electrical machine is a permanent-magnet variable reluctance machine.

13. A composite element comprising
a rigid mass suitable for comprising at least one magnetostrictive electrode bar,
at least one magnetostrictive electrode bar,
piezoelectric material in between said rigid mass material and said at least one magnetostrictive electrode bar,
wherein the rigid mass, the at least one magnetostrictive electrode bar and the piezoelectric material are arranged such that applying a voltage between the rigid mass and one or more magnetostrictive electrodes, causes piezoelectric effects in the piezoelectric material inducing stress in the bi-axial plane of the magnetostrictive bars and a diminished permeability of the magnetostrictive bars in a direction perpendicular to the bi-axial stress plane.

14. A method for altering the reluctance of a composite element according to claim 1, wherein the method comprises applying a voltage between the rigid mass and one or more magnetostrictive bars thus inducing shrinking of the piezoelectric material and inducing stress in a bi-axial plane of the magnetostrictive bars and a change of the permeability of the magnetostrictive bars in a direction perpendicular to the bi-axial stress plane.

15. A method of inducing motion or actuation of an element, the element being in connection with an electrical machine comprising a stator and a rotor, one of said stator and rotor being according to claim 1, the method comprising
subsequently controlling different relative positions between the stator and the rotor by subsequently altering a voltage between the rigid mass and one or more magnetostrictive bars so as to induce a relative motion thus inducing shrinking of the piezoelectric material and inducing stress in a bi-axial plane of the at least one magnetostrictive bar and a change of the permeability of the magnetostrictive bars in a direction perpendicular to the bi-axial stress plane.

* * * * *